(12) United States Patent
Satpathy et al.

(10) Patent No.: US 10,083,034 B1
(45) Date of Patent: Sep. 25, 2018

(54) METHOD AND APPARATUS FOR PREFIX DECODING ACCELERATION

(71) Applicant: Intel Corporation, Santa Clara, CA (US)

(72) Inventors: Sudhir K. Satpathy, Hillsboro, OR (US); Vinodh Gopal, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/713,526

(22) Filed: Sep. 22, 2017

(51) Int. Cl.
*H03M 7/40* (2006.01)
*G06F 9/30* (2018.01)

(52) U.S. Cl.
CPC .......... *G06F 9/3016* (2013.01); *G06F 9/3004* (2013.01); *G06F 9/30149* (2013.01)

(58) Field of Classification Search
CPC .. G06F 9/3016; G06F 9/3004; G06F 9/30149; H03M 7/40; H03M 7/4037; H03M 7/3088; H03M 7/6005; H03M 7/6023
USPC ............................................. 341/65, 67, 87
See application file for complete search history.

(56) References Cited

U.S. PATENT DOCUMENTS 8,125,357 B1 * 2/2012 Hamlet ............... H03M 7/3086
341/50
9,306,596 B2 * 4/2016 Satpathy ............. H03M 7/3059

OTHER PUBLICATIONS

Deutsch, "Deflate Compressed Data Format Specification version 1.3," Network Working Group, RFC 1951, May 1996, 15 pages.
Huffman, "A Method for the Construction of Minimum-Redundancy Codes," Proceedings of the IRE (vol. 40, Issue: 9, Sep. 1952), pp. 1098-1101.

* cited by examiner

*Primary Examiner* — Khai M Nguyen
(74) *Attorney, Agent, or Firm* — Alliance IP, LLC

(57) ABSTRACT

In one embodiment, an apparatus comprises a memory, a processor and a prefix decoder engine to access a plurality of code lengths of a header associated with a compressed data block; determine a number of instances of each code length of at least some of the plurality of code lengths; and operate a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

20 Claims, 19 Drawing Sheets

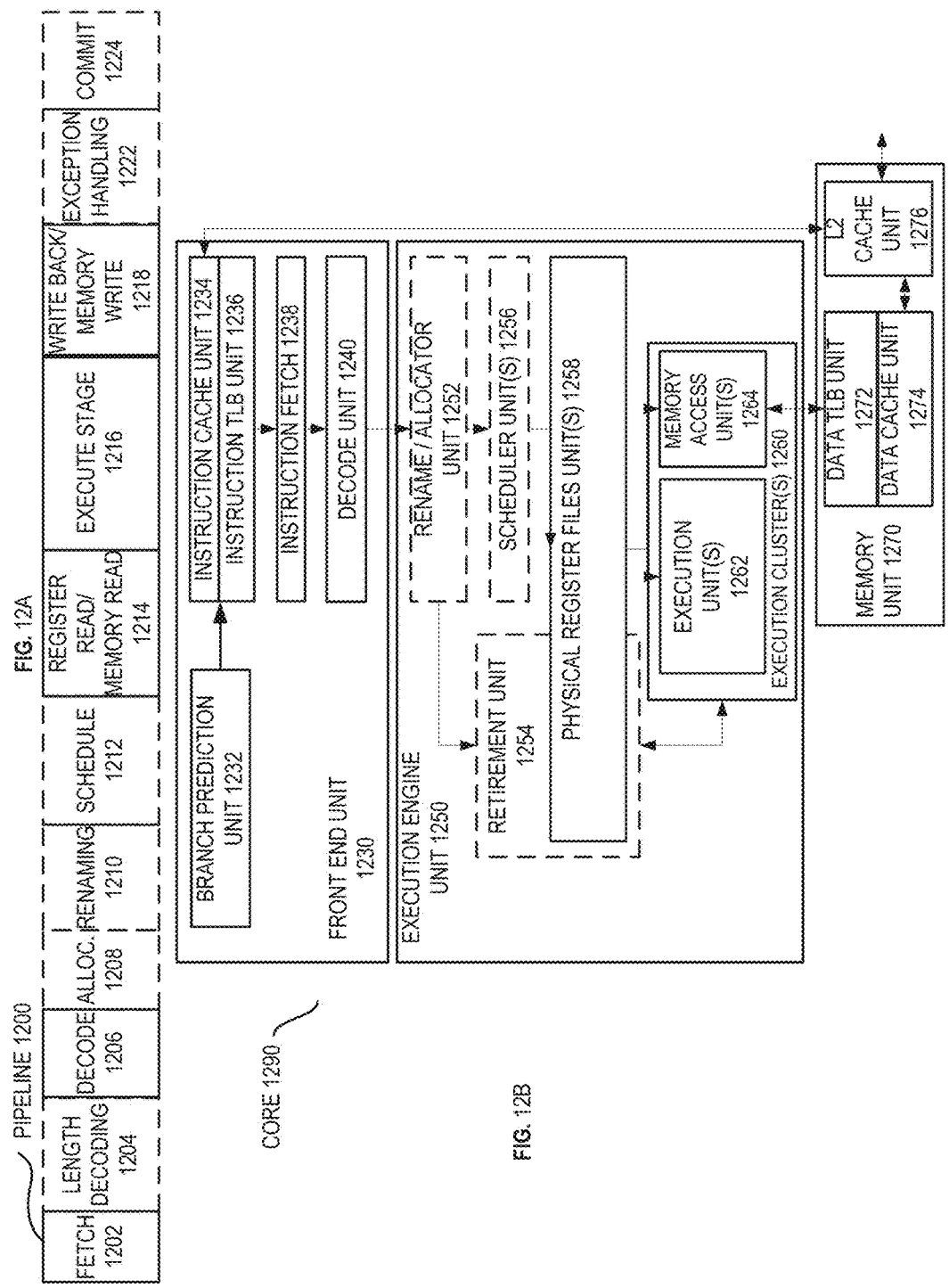

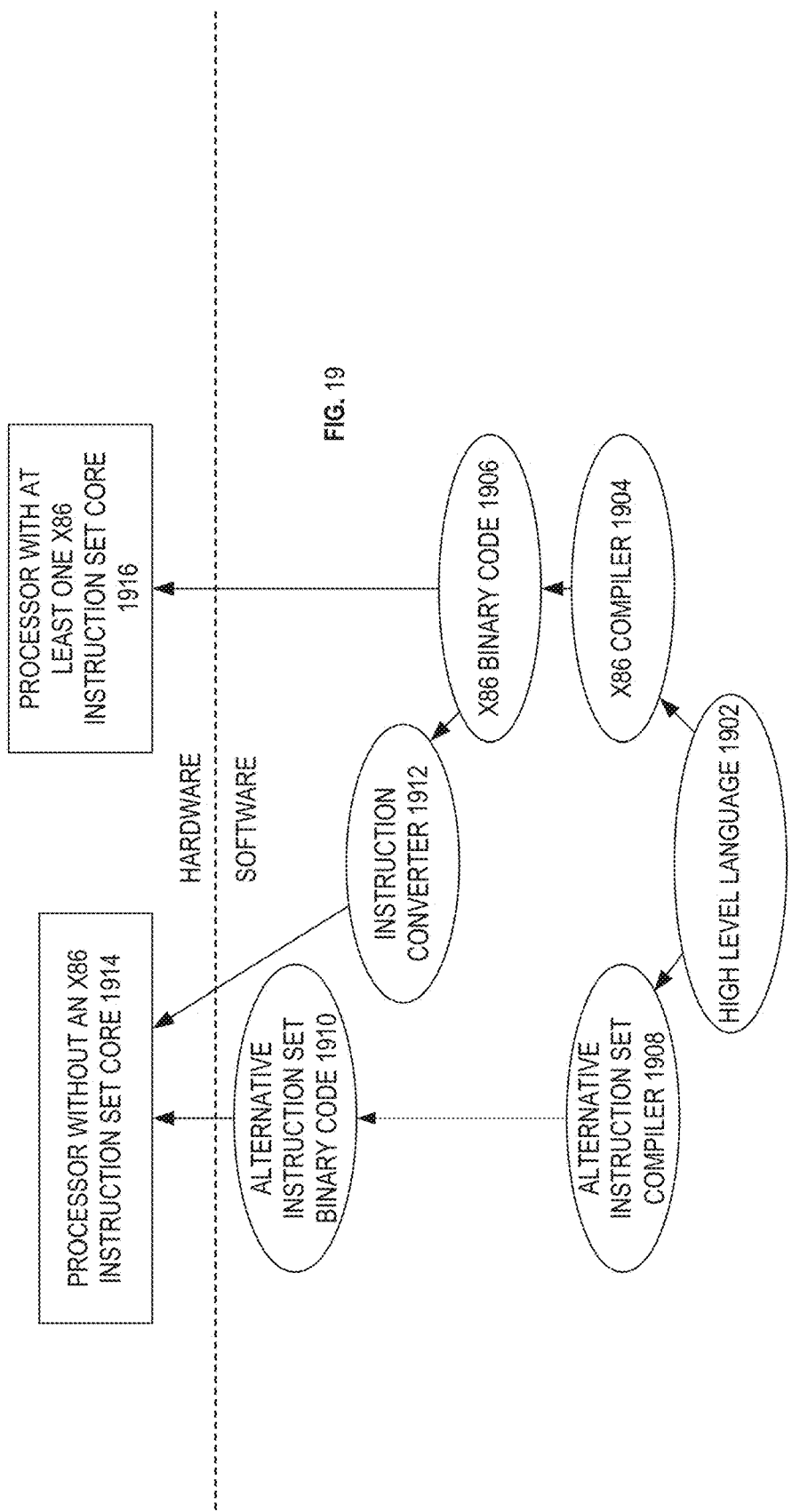

METHOD AND APPARATUS FOR PREFIX DECODING ACCELERATION

FIELD

The present disclosure relates in general to the field of computer development, and more specifically, to data decompression.

BACKGROUND

A computing system may include one or more processors, one or more memory devices, and/or one or more communication controllers, among other components. Logic of the computing system may be operable to access and decompress a compressed data set.

BRIEF DESCRIPTION OF THE DRAWINGS

FIG. 12A is a block diagram illustrating both an exemplary in-order pipeline and an exemplary register renaming, out-of-order issue/execution pipeline in accordance with certain embodiments.

FIG. 12B is a block diagram illustrating both an exemplary embodiment of an in-order architecture core and an exemplary register renaming, out-of-order issue/execution architecture core to be included in a processor in accordance with certain embodiments;

FIG. 19 is a block diagram contrasting the use of a software instruction converter to convert binary instructions in a source instruction set to binary instructions in a target instruction set in accordance with certain embodiments.

Like reference numbers and designations in the various drawings indicate like elements.

DETAILED DESCRIPTION

Figure 1:
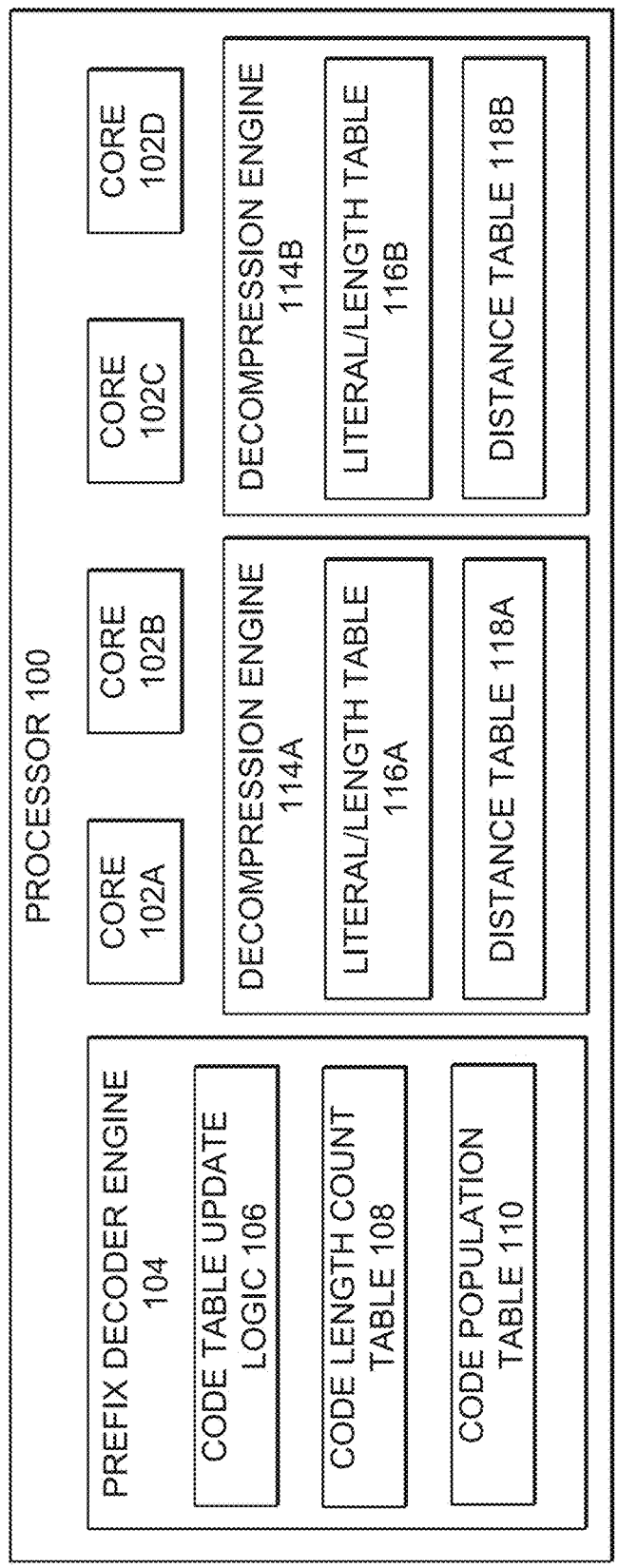
FIG. 1 illustrates a block diagram of an example processor comprising a prefix decoder engine and a plurality of decompression engines in accordance with certain embodiments.

FIG. 1 illustrates a block diagram of an example processor 100 comprising a prefix decoder engine 104 and a plurality of decompression engines 114 (e.g., 114A and 114B) in accordance with certain embodiments. Processor 100 may also include a plurality of cores 102 and any other suitable components. Prefix decoder engine 104 may provide decompression acceleration according to various embodiments described herein.

Data compression is becoming an integral part of many information processing systems because of its ability to reduce storage requirement and communication bandwidth. Data compressed using lossless standards (e.g., gzip) has very high entropy and is generally decompressed before any subsequent processing takes place. Because of its critical role at the front end of information processing systems, decompression acceleration is critical for improving overall throughput.

Various embodiments may provide a prefix decoder engine 104 and decompression engines 114 to decompress a DEFLATE payload (or other payload that is encoded using a prefix coding scheme). DEFLATE is a widely deployed lossless compression/decompression standard and is used in many software applications/libraries including, but not limited to, GZIP, PKZIP, BZIP2, ZLIB, 7-ZIP, PNG, .ZIP, and other applications. The DEFLATE algorithm is specified in its basic format in Request for Comments (RFC) 1951, available at https://www.ietf.org/rfc/rfc1951.txt. The DEFLATE operation compresses raw data into a stream of literal symbols and length+distance symbols that are subsequently Huffman encoded based on their frequency of occurrence to achieve further compression. Each symbol is represented by a code varying in length from 1b-15b. Some of the codes used to encode length and distance symbols may also utilize a variable number of additional bits (0-13b) from the payload that are concatenated with the Huffman decoded base during decompression. A code (also referred to herein as a token) may refer to one or more bits that compactly represent a value, such as a literal byte, a distance, a length, or other suitable value.

Huffman encoding based compressed data streams such as those generated by lossless compression packages like GZIP are appended with a header specifying the Huffman codes that constitute the payload. To reduce header overhead, this metadata is further compressed using a set of code-words that are again Huffman encoded using an additional tree as described in the standard. A compressed payload generated according to the DEFLATE algorithm using dynamic Huffman encoding achieves better compression ratios by taking advantage of entropy encoding that is uniquely optimized for the frequency distribution of its tokens. However, the additional compute complexity for retrieving these tokens by reconstructing the Huffman tree for every data block limits the maximum achievable decompression throughput.

Generation of Huffman trees from such compressed metadata using a generic microcode based approach incurs thousands of cycles of latency, causing significant decompression throughput loss as payload size decreases (e.g., ~50% penalty for 1 Kilobyte (KB) data blocks). Furthermore, for small payloads (e.g., a few KBs) comprising a few thousand tokens, Huffman tree generation latency may dwarf subsequent decompression latency. Tree generation acceleration may involve the use of a double serial parse approach that processes one code length of the header per cycle. However, the presence of, e.g., 316 codes (up to 286 literal/length and 30 distance codes) renders such an approach very slow, typically spanning ~700 clock cycles.

Various embodiments of the present disclosure provide systems that accelerate tree generation (i.e., prefix decoding) that skip non-existent codes, optimally process repeating codes, and/or parallelize tree generation using check-pointing and concurrent forward/reverse tree parsing approaches that may reduce overall tree generation latency by 3×.

In addition, various embodiments may provide a parallel decompression approach in which a single prefix decoder engine services multiple payload decompressors (i.e., decompression engines) in a round-robin configuration, thus amortizing logic overhead and improving hardware utilization. The latency reduction techniques provided by various embodiments may improve single thread decompression throughput (particularly for small payloads) as well as provide area savings in high throughput multithreaded parallel implementations by using fewer Huffman tree decoders without negatively impacting performance.

Literal/length and distance codes of a Huffman tree are serially appended in a pre-specified order in a header of a block as described in the DEFLATE standard. All code lengths of the header need to be accessed to gather code counts (i.e., the number of times particular code lengths appear in the header). Once the code counts for each code length have been determined, the actual Huffman code values may be serially generated. Various embodiments of the present disclosure break this serial dependency and allow multiple codes to be generated based on the code lengths in parallel, enabling faster tree generation.

As described above, various Huffman tree decoder techniques may limit decompression throughput due to use of a serial tree parsing scheme that requires computing Huffman codes of all preceding tokens before a new token may be decoded. Various embodiments of the present disclosure break this serial dependency with reverse tree traversal and check-pointing assisted decoding schemes, thus providing dramatic performance improvement (e.g., up to 3× improvement for sparse trees). Faster tree generation also allows a decompression engine to limit idle cycles, enabling early payload processing. In various embodiments, for small compressed payloads that span 1-4 KB, the overall decompression throughput may be improved by 30-54%.

The Huffman tree generation acceleration techniques described herein may also enable a multithreaded decompressor architecture wherein multiple payload processing engines (e.g., decompression engines 114) share a common tree decoder (e.g., prefix decoder engine 104) operating in round-robin fashion. In various embodiments, performance improvement may be traded for area savings by deploying fewer decoders in a system.

There are several situations where Huffman tree generation acceleration may enable significant system level savings. For example, various embodiments described herein may be used in an offload and cryptography subsystem that accelerates Advanced Encryption Standard (AES) operations and other cryptographic workloads and may, in some embodiments, improve a compression ratio by ~20%, reducing the size of memory that stores compressed firmware, thus reducing overall system cost. As another example, various techniques described herein may accelerate field-programmable gate array (FPGA) programming by enabling compressed FPGA configuration streams, which are subsequently decompressed at the point of consumption within the FPGA. Various embodiments may be used in any other suitable decompression application.

While the embodiments of the disclosure described below focus on a DEFLATE compression operation using Huffman coding, the underlying principles of the disclosure may be implemented on any form of prefix coding and may also be used in other forms of lossless compression algorithms. As various examples, the techniques described herein may be applied to improve decoding performance for other forms of Huffman codes such as used in JPEG, MPEG, MP3, PNG, or other lossless compression algorithms.

In the embodiment of FIG. 1, a single prefix decoder engine 104 and a set of one or more decompression engines 114 are shared by all of the cores 102. In an alternate embodiment, each core includes its own instance (or multiple instances) of a prefix decoder engine 104 and/or decompression engine set. In yet another embodiment, the prefix decoder engine 104 and/or decompression engines 114 may be implemented on a semiconductor chip separate from the semiconductor chip of the processor 100 and may be communicatively coupled to the processor over a communication link/bus. The underlying principles of the present disclosure are not limited to any particular architectural arrangement for integrating the prefix decoder engine 104 and decompression engines 114 into a computer system.

Prefix decoder engine 104 includes code table update logic 106, code length count table 108, and code population table 110. Prefix decoder engine 104 may parse a header of a data block and utilize its respective tables to generate the tokens of literal/length tables 116 (e.g., 116A and 116B) and distance tables 118 (e.g., 118A and 118B) of decompression engines 114. The tables 116 and 118 may comprise lookup tables that may be implemented using any suitable type of memory. Non-limiting examples of memory that could be used to store the lookup tables include static random-access memory (SRAM) and content addressable memory (CAM) (e.g., NOR or NAND based CAMs). In other embodiments, any suitable number of tables may be used to store tokens used during decoding. Similarly, any suitable type of memory may be used to store tables 106, 108, and 110.

Code table update logic 106 analyzes a payload header of an incoming data block and populates code tables 108, 110, 116, and 118 based on information specified in the header. In various embodiments, the payload header may specify a plurality of code lengths that may be used to determine the codes used for the literal, length, and distance symbols. In various embodiments, these code lengths themselves may be Huffman encoded.

In one embodiment, symbol values corresponding to the literal and length codes for a data block are placed together in literal/length table 116, while symbol values corresponding to the distance codes for the data block are stored in distance table 118. After the tables 116 and 118 are populated, literals and/or length+distance pairs from the payload are decoded by decompression engine 114 by matching codes from the payload to codes included in the tables to recreate the original bit-stream by a decompression engine 114.

Every new block's header is processed to generate Huffman codes unique to the block's symbols and the corresponding symbol values are populated into the tables at indices corresponding to the codes. A header of a new block is processed after the EOB symbol of the current block is reached during decoding and all tables are repopulated before decoding the new block of compressed data.

In a particular embodiment, decompression engine 114 comprises at least one lookup table (e.g., literal/length table 116 and/or distance table 118) that includes entries addressed by codes. For example, an address that includes (e.g., begins with) a code may be used as an index into the table and a symbol value corresponding to the code may be obtained from the corresponding entry of the table. In various embodiments, an entry of the lookup table also includes a validity identifier specifying whether the entry stored in the entry of the lookup table is valid and a length identifier specifying how long the code was (since the address used to index the lookup table may include subsequent bits that are not a part of the current code if the address ends up being longer than the identified code). The symbol values may be expressed in any suitable manner. In a particular embodiment, a symbol value of a literal may be a value from 0 to 255 corresponding to a literal byte, a symbol value of a length includes bits specifying at least a portion of the length (e.g., the most significant bits) and (at least in some cases) bits specifying how many additional bits from the payload should be appended to the bits specifying the portion of the length, and a symbol value of a distance includes bits specifying at least a portion of the distance (e.g., the most significant bits) and (at least in some cases) bits specifying how many additional bits from the payload should be appended to the bits specifying the portion of the distance.

In DEFLATE, the payload header includes the code lengths for the 256 literal codes, end-of-block (EOB) code, a maximum of 20 length codes and 30 distance codes in a pre-specified order as described in the DEFLATE standard. Hence, in various embodiments the Huffman codes are also generated in this pre-specified order and progressively stored in the literal/length table 116. Since the order is specified by the DEFLATE standard, the prefix decoder engine 104 knows which codes (and corresponding symbols) correspond to particular code lengths, thus the first Huffman code stored in the literal/length table 116 is the code corresponding to symbol 0, the second Huffman code stored is the code corresponding to symbol 1, and so on (where the symbol numbers are defined by the DEFLATE standard). In other embodiments, the codes may be stored in any suitable order.

During Huffman decoding, decompression engine 114 compares a portion of the payload against entries in the code tables. A successful decode cycle results in generation of the code length and the corresponding symbol for the matching Huffman code. The code length is used to advance the encoded stream to fetch the next payload. For example, the sum of the code length and (if applicable) the extra number of bits that get picked from the payload is the actual number of bits that gets consumed in any particular decode cycle. The payload is shifted (i.e., the index of the decoder advances) by the number of bits consumed to generate the next set of bits (e.g., 15 bits) to be used for decoding.

Figure 2:
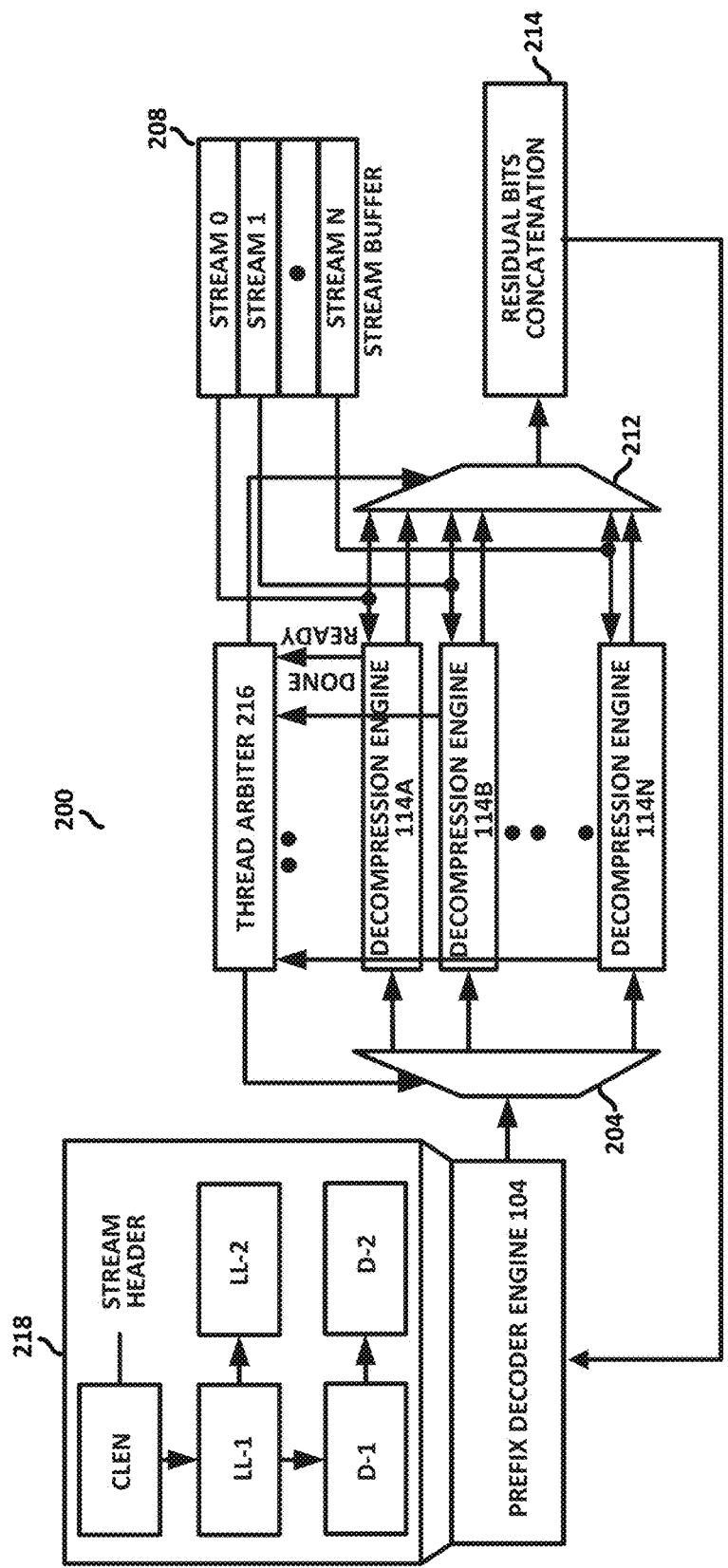
FIG. 2 illustrates a prefix decoder engine and a plurality of decompression engines in accordance with certain embodiments.

FIG. 2 illustrates a prefix decoder engine 104 and a plurality of decompression engines 114 (e.g., 114A-114N) in accordance with certain embodiments. FIG. 2 also illustrates demultiplexing logic 204, stream buffer 208 storing data streams 0-N, multiplexing logic 212, residual bits concatenation logic 214, and thread arbiter 216.

In a particular embodiment, a single dynamic prefix decoder engine 104 (which may have any suitable attributes of prefix decoder engine 104) may service multiple decompression engines 114A-114N (which may have any suitable attributes of decompression engines 114) in a round-robin manner enabling several decompression threads to run in parallel for higher throughput. Multiple decompression engines 114 may operate on independent dynamically compressed streams (stream 0 to stream N) in parallel with their unique Huffman trees. When a decompression engine 114 (e.g., 114A) reaches an end of block (EOB) character in its respective stream (stream 0 in this example), the decompression engine may send a "done" signal to thread arbiter 216. Thread arbiter 216 may control demultiplexing logic 204 to couple prefix decoder engine 104 to the decompression engine 114A. A new Huffman tree for the next block to be decompressed by decompression engine 114A may be generated by the prefix decoder engine 104 based on code lengths in a header of the next block of stream 0 and the prefix decoder engine 104 may populate the literal/length table 116 and the distance table 118 within decompression engine 114A. The decompression engine may then decompress the payload of the data block.

This same process may be repeated when any of the decompression engines 114 reaches an EOB character in a data block of its respective stream. In various embodiments, thread arbiter 216 may control which stream is provided to prefix decoder engine 104 when multiple decompression engines are waiting for the prefix decoder engine 104 to generate codes for their next data block. Such an architecture allows the shared prefix decoder engine 104 to decouple seamlessly from one decompression engine 114 to service the next. In various embodiments, one or more decompression engines 114 may decompress payloads simultaneously with the generation of Huffman codes by the prefix decoder engine 104 for another one of the decompression engines 114.

In a particular embodiment, the Huffman codes for the literal/length table 116 and the distance table 118 are each generated by the prefix decoder engine 104 using a double parse technique. A flow for this double parse technique performed by the prefix decoder engine 104 is depicted at 218. During the first parse (depicted in FIG. 2 as LL-1) of code metadata (e.g., a DEFLATE header) associated with the literal/length codes, the number of codes corresponding to each code length (of the set of code lengths CLEN) is updated and stored in code length count table 108.

After the first parsing of the header, the starting Huffman codes for each code length are generated. Each entry in the code population table 110 may correspond to a particular code length and may store the next code for that particular code length (which will be stored in the literal/length table 116 when the code length is processed). The initial codes of table 110 may be generated based on the code counts of table 108 (e.g., according to the DEFLATE specification or other information describing the method used during Huffman encoding). The initial codes stored in the code population table 110 represent the first Huffman codes for each code length. For example, the first code of table 110 represents the first Huffman code of length 1 (if any), the second code of table 110 represents the first Huffman code of length 2 (if any), and so on. A particular entry is only used in populating the literal/length table 116 if code lengths of that size exist.

During the second parsing of the literal/length code lengths of the header (depicted as LL-2), a code length is accessed and used to index into the code population table 110. The Huffman code at the corresponding index of code population table 110 is read by and output into the literal/length table 116A. The code at the indexed entry of code population table 110 is then incremented (or otherwise updated) to generate the next code that is the same length as the accessed code (in Huffman encoding, the numeric value of a code is simply one more than the numeric value of the previous code of the same length). This process continues until each code length corresponding to the literal/length codes have been processed.

The code lengths corresponding to the distance codes may be processed in a similar manner, using a first parse (D-1) similar to LL-1 and a second parse (D-2) similar to LL-2. Since the minimum number of literal/length tokens is much higher than the maximum number of distance tokens for a DEFLATE payload, the distance tree generation latency may be eliminated by starting the distance token parse prior to literal/length decode completion. For example, at least a portion of the first parse of the distance code lengths (D-1) may be performed in parallel with at least a portion of the second parse of the literal/length codes (LL-2). In a particular embodiment, this may reduce overall decoder latency by 11%.

The variable length encoding scheme used to compress the payload may result in boundary misalignment between the EOB character and the end of the last word (e.g., set of bits) consumed by a decompression engine, making it likely that a new block starts at some random index within a fetched word. Residual bits concatenation logic 214 combines leftover bits (i.e., the bits after the EOB character) from the last word consumed by a decompression engine (wherein the last set includes the EOB character) with a portion of the next block from the stream to allow the prefix decoder engine 104 to accurately process the new header of the block. Thread arbiter 216 may control multiplexing logic 212 to enable the leftover bits from the last word of the appropriate stream to be passed from the corresponding decompression engine to the prefix decoder engine 104.

As described above and with respect to the other figures, various embodiments reduce the tree generation latency of a Huffman decoder. This may improve decompression throughput for any individual thread by eliminating inter-block idle cycles (which may be especially significant for small payloads). This may also improve overall system throughput by allowing an increased number of decompression engines per prefix decoder engine for higher parallelism and better hardware utilization.

Figure 3:
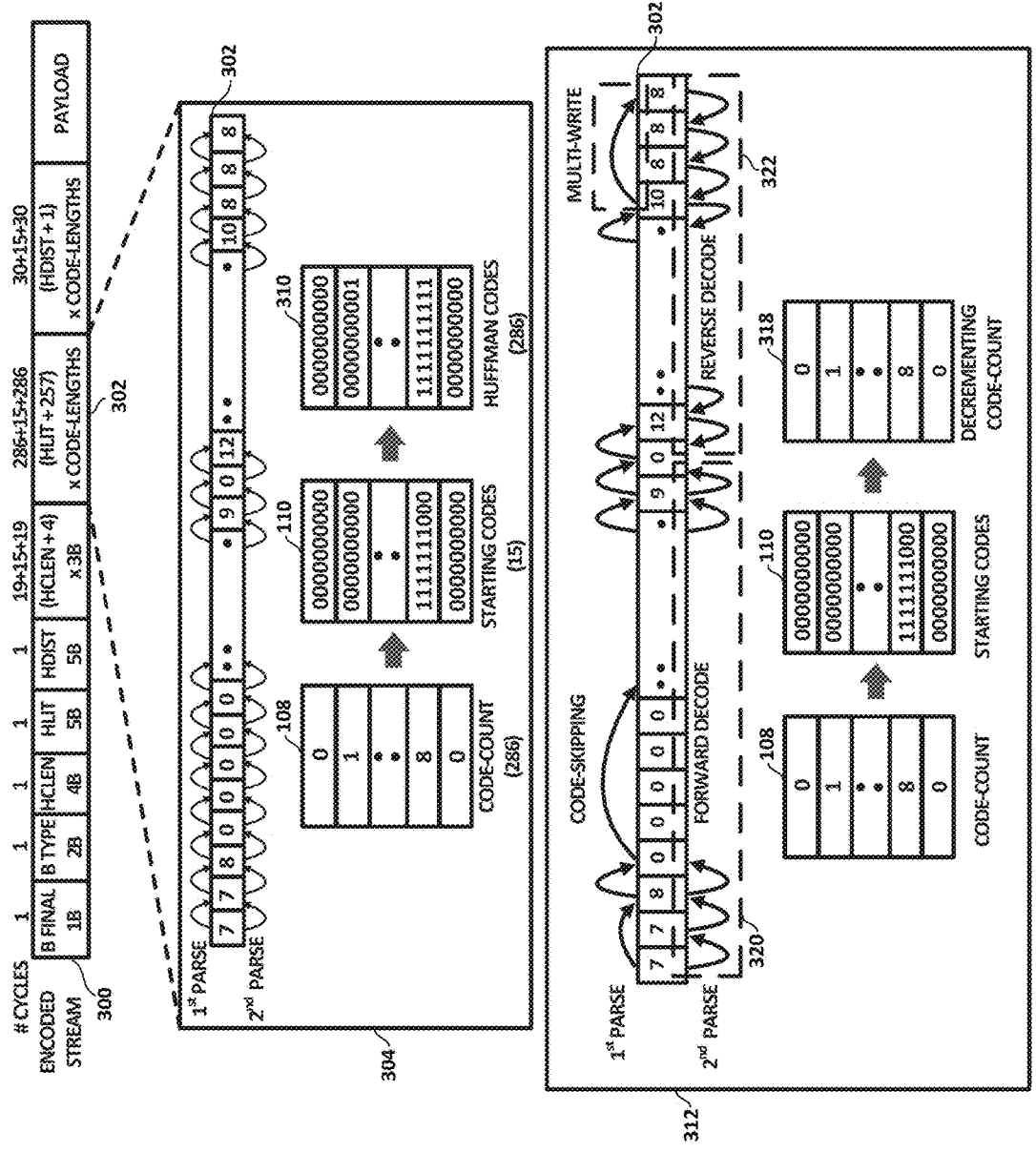
FIG. 3 illustrates a first prefix decoding scheme that includes a single forward stream and a second prefix decoding scheme that includes a forward stream and a backward stream in accordance with certain embodiments.

FIG. 3 illustrates a first prefix decoding scheme 304 that includes a single forward decode stream and a second prefix decoding scheme 312 that includes a forward decode stream and a reverse decode stream in accordance with certain embodiments. The prefix decoding schemes operate on data block 300 which includes various header portions and a payload portion.

BFINAL is set when the data block is the last data block of a data set. BTYPE specifies how the data are compressed (e.g., no compression, compressed with fixed Huffman codes, or compressed with dynamic Huffman codes). HCLEN indicates the number of code length codes (in the DEFLATE standard, HCLEN equals the number of code length codes–4 and the actual number of code length codes may be between 4 and 19). HLIT indicates the number of literal/length codes (in the deflate standard, H lit equals the number of literal/length codes −257, an actual number of literal/length codes may be between 257 and 286). HDIST indicates the number of distance codes (in the DEFLATE standard HDIST equals the number of distance codes −1, and the actual number of distance codes may be between one and 32). HCLEN+4 represents code lengths for the code length alphabet given by the previous headers.

Header portion 302 (HLIT+257) includes code lengths for the literal/length alphabet, encoded using the code length Huffman code. The decoding of this portion of the data block is represented by scheme 304 and scheme 312. HDIST+1 includes code lengths for the distance alphabet, encoded using the code length Huffman code. The payload of the data block follows the header portions.

As described above, the Huffman codes for the literal/length table 116 may be generated by the prefix decoder engine 104 using a double parse technique. During the first parse of the literal/length code lengths, the number of codes corresponding to each code length is updated and stored in code length count table 108. This first parse generally takes 286 cycles to generate all of the code counts. As shown in table 108 of scheme 304, for a particular header the number of 1-bit codes is 0, the number of 2-bit codes is 1, the number of 3-bit codes through 13-bit codes are not shown, the number of 14-bit codes is 8, and the number of 15-bit codes is 0. The code length count table 108 may include an entry for each possible code count (e.g., 15 entries for the DEFLATE algorithm).

Once the code counts are gathered, it takes 15 cycles to generate the starting codes (which are stored in code population table 110). After the starting codes are generated, all of the code lengths are parsed again and each time a particular code length is encountered, the code corresponding to the code length is retrieved from the code population table 110 (e.g., the code length may be used to index into the code population table 110) and associated, in the literal/length table 116, with the symbol corresponding to the code length that is being processing. The code in the entry of the code population table 110 that corresponds to the code length is then incremented by one. In scheme 304, the second parse includes one forward stream that begins at the first code length and advances serially by one code length towards the last code length of the header portion 302. The forward stream processes one code length per cycle, resulting in 286 cycles for the second parse.

Having a priori information of the number of codes for each code length allows generation of the last Huffman code for each code length in addition to the first Huffman code. This permits the launching of a reverse tree traversal operation that generates the Huffman codes for trailing indices (285, 284, 283, . . . ) of header portion 302 in addition to the forward operation for leading indices (0, 1, 2, . . . ) of header portion 302, thus reducing code-generation latency by half (that is, the second parse may, in a worst-case scenario, be completed in 143 cycles instead of 286).

Thus, instead of a single parsing stream that starts at the beginning of the code lengths of header portion 302 and moves to the end of the code lengths in a sequential fashion as depicted by scheme 304, in scheme 312, the decoding of the Huffman codes is performed using two separate parsing streams, a forward decode stream 320 beginning at the start of the code lengths and advancing forward through the code lengths and a reverse decode stream 322 beginning at the end of the code lengths and advancing backwards through the code lengths.

The forward stream 320 of scheme 312 operates in a manner similar to the forward stream of scheme 304 when determining code values corresponding to code lengths. In various embodiments, code population table 110 may comprise a 15-entry 15-bit look-up table that initially stores the starting Huffman codes that are accessed and selectively incremented by the forward decode stream for every non-zero code length to retrieve subsequent Huffman codes. Thus, the forward decode stream 320 may generate codes for the literal/length table 116 by accessing the code length of header 302 and retrieving the entry of code population table 110 that corresponds to the code length.

The reverse decode stream of scheme 312 may utilize a decrementing code count table 318 in conjunction with code population table 110 to determine code values for the code lengths processed by the reverse decode stream 322. In a particular embodiment, the decrementing code count table 318 comprises a 15-entry, 9-bit table that tracks the number of remaining codes to be processed for each code length, although any suitable memory structure may be used to store the decrementing code counts. When the reverse decode stream 322 processes a code length, it may determine the corresponding code by adding the code value of the appropriate entry (i.e., the entry corresponding to the code length) of code population table 110 to the value of the appropriate entry (i.e., the entry corresponding to the code length) of decrementing code count table 318 and subtracting one. Each time the forward decode stream 320 or the reverse decode stream 322 generates a code, the code count of table 318 corresponding to the code length processed is decremented by one. The reverse decode stream 322 may decrement the code so that the next time that code length is encountered by the reverse decode stream the resulting code will be one less than the code that was just generated by the reverse decode stream and the forward decode stream 320 may decrement the code so that the next time that code length is encountered by the reverse decode stream the resulting code does not change (because the corresponding code in the code population table 110 is increased by one when the forward decode stream 320 processes a code length).

The second parse of scheme 312 completes when the forward and reverse decode streams converge at a code length between the starting and ending indices (e.g., at a mid-way point), thus reducing latency of the second parse by half relative to scheme 304.

In scheme 304, the decoder advances by one code length every cycle, updating the code counts until it reaches the last code. These code lengths are revisited again in a serial manner during the second parse to generate the Huffman codes. In various embodiments of the present disclosure, a multi-write and/or code-skipping strategy may be used by the prefix decoder engine 104 to advance multiple code lengths in a cycle during the first parse to improve throughput. The Huffman encoding that is performed on the code lengths may include a special code that indicates a number of subsequent repeated zero values (code lengths of zero indicate that the particular codes are not used in the data block). The processing of repeated zero length codes may be accelerated using a code-skipping scheme. For example, in scheme 312, a code skipping scheme is used to skip from the fourth code length to the ninth code length. The code skipping scheme will be discussed in more detail in connection with FIG. 5.

The Huffman encoding that is performed on the code lengths may include another special code that indicates that a particular code length is repeated a specified number of times. The processing of repeated code lengths may be accelerated using a multi-write scheme. For example, in scheme 312, a multi-write scheme is used to process the last three code lengths of 8 in a single cycle. The multi-write scheme will be discussed in more detail in connection with FIGS. 6 and 7.

Figure 4:
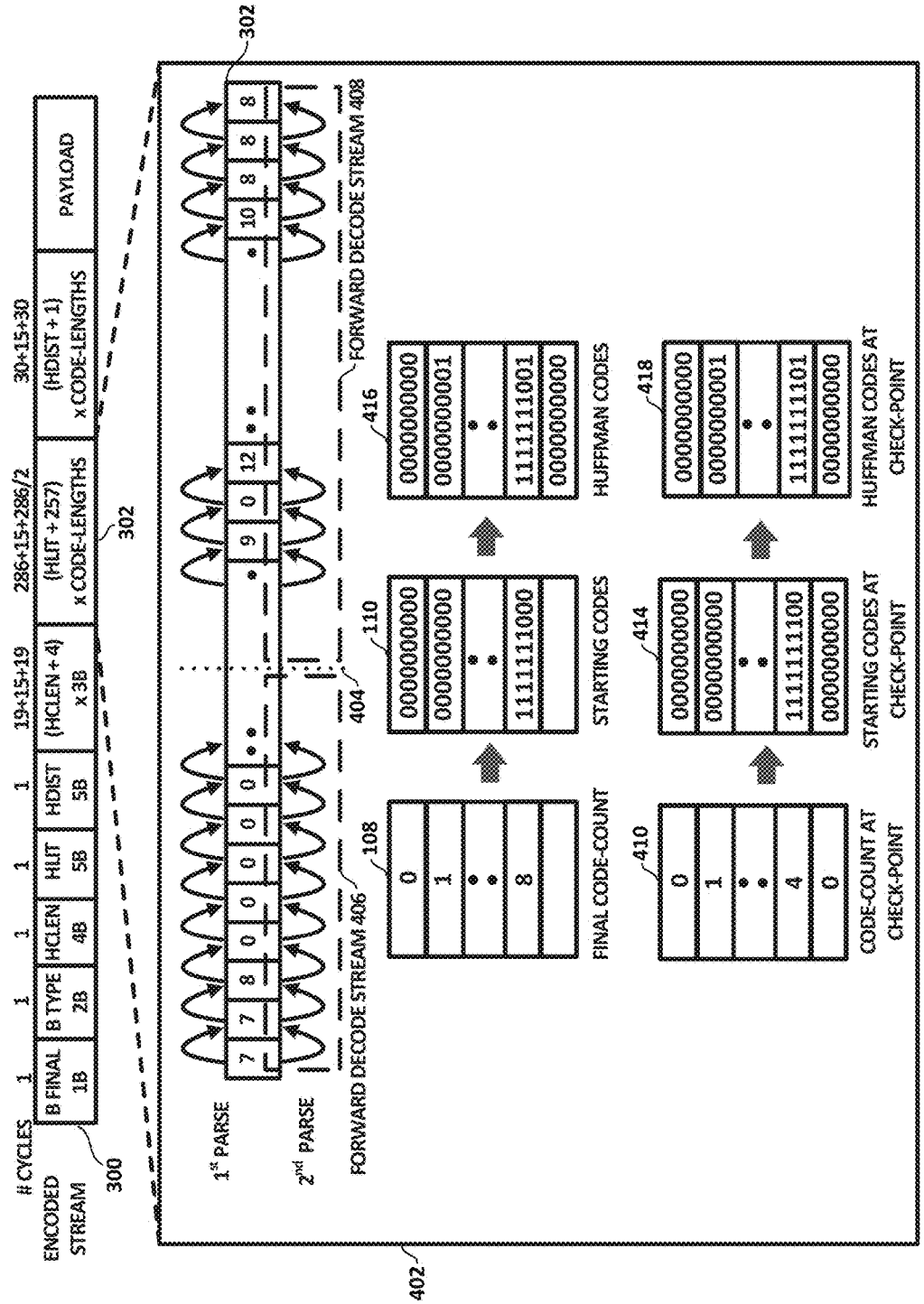
FIG. 4 illustrates example decoding techniques employed by a prefix decoder engine that operates multiple forward streams in accordance with certain embodiments.

FIG. 4 illustrates example decoding techniques employed by a prefix decoder engine 104 that operates multiple forward decode streams 406 and 408 in accordance with certain embodiments. In various embodiments, Huffman codes may be generated at any arbitrary code index of the header portion 302 during the second parse by check-pointing the code count at the preceding index during the first parse into a checkpoint code count table 410. The running code counts of table 410 may later be added to the starting codes (i.e., the initial values of code population table 110) to generate a new set of starting codes for the index of the checkpoint. The new set of starting codes is stored in checkpoint code population table 414. In addition to the forward decode stream 406 launched at the start of the code lengths, another forward decode stream 408 may be launched at this prior chosen code index utilizing this new set of starting codes to further accelerate the tree decoding process. Although FIG. 4 depicts a single additional decode stream, any suitable number of decode streams may be launched using similar check-points.

In the example depicted, a checkpoint 404 is established at the halfway point of header portion 302 (for example at index 286/2=143 or other suitable index). When the first parse reaches checkpoint 404, the code length counts are copied into a checkpoint code count table 410. The checkpoint code count table 410 is similar to the code count table 108, but table 410 includes the number of times each code length has appeared in header portion 302 up to the checkpoint 404 (whereas the code count table 108 includes the number of times each code length appeared in the entire header portion 302).

After the first parse is complete, code population table 110 is generated based on the values of code count table 108. Checkpoint code population table 414 is then generated based on the entries of code population table 110 and the entries of checkpoint code count table 410. For example, each entry of checkpoint code population table 414 is generated by adding the corresponding entry of code population table 110 with the corresponding entry of checkpoint code count table 410. For example, the next to last entry of checkpoint code population table 414 ("1111111100") is generated by adding the next to last entry of code population table 110 ("1111111000") to the next to last entry of the checkpoint code count table 410 ("8"). The forward decode stream 408, which operates in parallel with the forward decode stream 406, may generate a code for a code length by accessing the entry of checkpoint code population table 414 corresponding to the code length. After a code for a particular code length is generated and copied to literal/length table 116 by the forward decode stream 408, the entry of checkpoint code population table 414 corresponding to the code length is incremented. Thus, the forward decode stream 406 may generate a first set of Huffman codes 416 that are stored in a literal/length table 116 and the forward decode stream 408 may generate a second set of Huffman codes 418 that is stored in the literal/length table 116, where the first and second sets include all of the Huffman codes stored in literal/length table 116. In embodiments employing additional forward decode streams, additional pairs of checkpoint code population tables and checkpoint code count tables may be used where the initial entries of each checkpoint code population table are generated by adding the values of code population table 110 to the relevant values of the associated checkpoint code count table. Any additional forward decode stream may operate in a manner similar to forward decode stream 408 by processing a code length by retrieving the associated code from its checkpoint code population table and incrementing the code.

In various embodiments, any number of one or more forward decode streams may be operated in parallel with any number of one or more reverse decode streams by utilizing the appropriate checkpoints code population tables, checkpoint code count tables, and/or decrementing code count tables. In various embodiments utilizing multiple forward decode streams, logic of the prefix decoder engine 104 may select the checkpoints based on results of the first parse such that the forward decode streams complete operation at the same time. One example related to this concept is explained in more detail in connection with FIG. 5.

Figure 5:
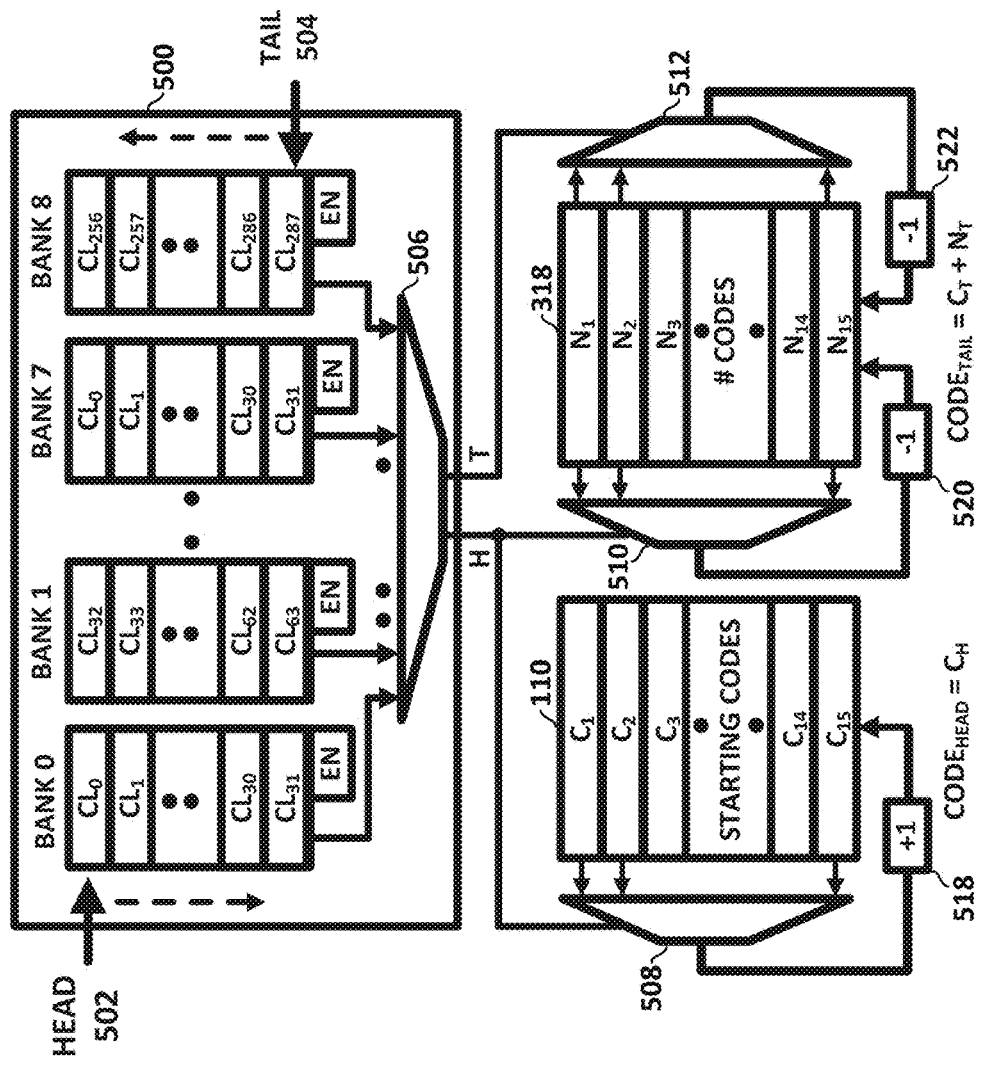
FIG. 5 illustrates an example memory with a plurality of banks that may be selectively enabled, a code population table, and a decrementing code count table in accordance with certain embodiments.

FIG. 5 illustrates an example memory 500 with a plurality of banks (bank 0 through bank 8) that may be selectively enabled, a code population table 110, and a decrementing code count table 318 in accordance with certain embodiments. In various embodiments, during the first parse, the code lengths may be copied into a code length array stored in any suitable type of volatile or non-volatile memory 500 (the second parse may then operate on the code lengths stored in the memory 500).

Payload headers may contain consecutive unused literal/length and distance codes (which have corresponding code lengths of zero) that are often compressed using special codes indicating runs of zeros. Such codes are easy to skip during the first parse (if the code length array is initialized to zeros) because of the availability of precise information about their sequence length. However, in a multi-threaded parallel implementation in which a single prefix decoder engine decodes headers for multiple decompressions engines (e.g., as depicted in FIG. 2), the code length array of the prefix decoder engine 104 usually stores lengths from a prior block header (e.g., from a different decompression engine) and the entries corresponding to the unused codes need to be explicitly cleared (i.e., they cannot be skipped over when runs of zero-length codes are encountered).

In general, a bank of a memory does not include a large number of write ports, thus a prefix decoder engine may not have the ability to simultaneously write a plurality of zero valued code lengths to the code length array. In various embodiments of the present disclosure, in order to skip consecutive zero length codes (i.e., to avoid writing each code length to the code length array), the code length array is partitioned into multiple banks, and each bank is tagged with a bit that selectively enables the respective bank. If all of the entries of the bank are to store zero as the code lengths, the bit associated with the bank may be set to disable the bank (rather than writing a zero value to or otherwise clearing each entry of the bank). Subsequently, this information can be used in the second parse to quickly advance past non-existent codes for faster decoding. Thus, prefix decoder engine 104 may maintain a bit-vector in which each bit is set when the corresponding bank does not store any non-zero length codes and can be entirely skipped in a single cycle during the second parse. If the number of consecutive zeros is greater than the size of a bank, the relevant bank may be disabled and the relevant code length entries of the preceding and/or successive bank may be written to zero (based on which particular code lengths are zero). Although a particular bank size is depicted (e.g., each bank stores 32 code lengths), the banks may have any suitable size (e.g., each bank may store 8, 16, or other number of code lengths).

The embodiment depicted in FIG. 5 corresponds to decoding scheme 312 which utilizes a forward decode stream 320 and a reverse decode stream 322. The forward decode stream utilizes a head pointer 502 that initially points to the first entry of the code length array and advances forward as the codes corresponding to the code lengths are generated. If the head pointer 502 encounters a bank that is disabled, the head pointer 502 may move to the first entry of the next bank. The reverse decode stream utilizes a tail pointer 504 that initially points to the last entry of the code length array and advances backward as the codes corresponding to the code lengths are generated. If the tail pointer 504 encounters a bank that is disabled, the tail pointer 504 may move to the last entry of the preceding bank. In embodiments including multiple forward decode streams, each forward decode stream may check the enable bit of a bank before generating any codes based on the code lengths of the bank.

When the forward decode stream processes a code length, it may use the code length as an index into the code population table 110 to determine the corresponding code (thus $CODE_{HEAD}=C_H$). The forward decode stream may then increment the retrieved value of the code population table 110 and decrement the corresponding value of the decrementing code table 318. When the reverse decode stream processes a code length, it may use the code length as an index into the code population table 110 to obtain a corresponding code value and add it to the corresponding value of decrementing code table 318 and then subtract one (thus $CODE_{TAIL}=C_T+N_T-1$). The reverse decode stream may then decrement the corresponding value of the decrementing code table 318.

As alluded to earlier, instead of setting checkpointing indices or reverse decoder starting indices to fixed values, in particular embodiments, a state machine or other logic of prefix decoder engine 104 may optimally determine the indices based on the total number of existing codes (taking into account the banks that are disabled) for every new data block in order to cause the multiple decode streams to complete on the same cycle (or as close as possible to the same cycle) to minimize idle cycles and maximize performance. This may offer particular benefits for small payloads that compress a few hundred tokens and exhibit sparse literal/length and distance Huffman trees wherein only a few tokens are used.

Figure 6:
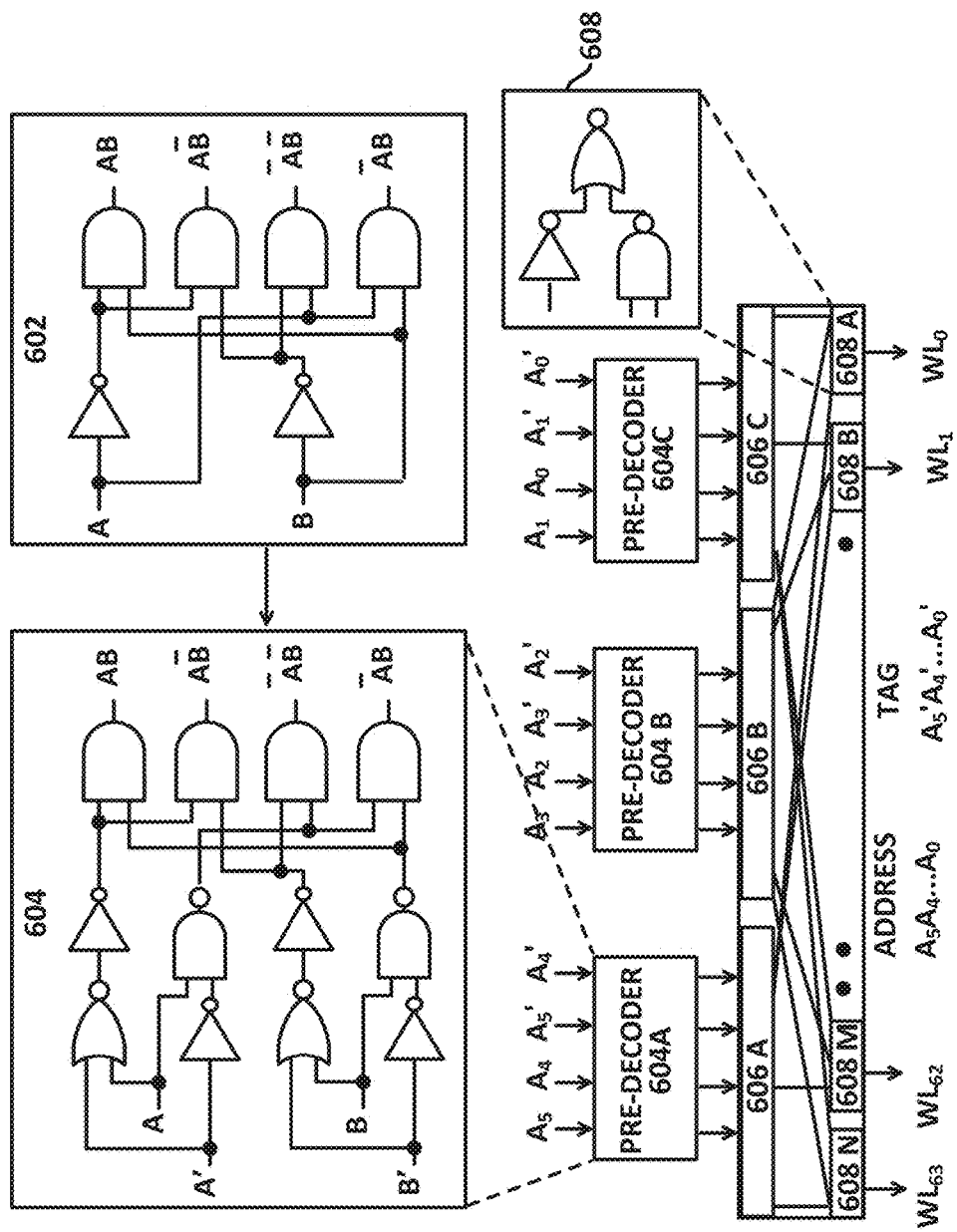
FIG. 6 illustrates example pre-decode logic enabling a multi-write scheme in accordance with certain embodiments.

FIG. 6 illustrates example pre-decode logic enabling a multi-write scheme in accordance with certain embodiments. Repeating code lengths are frequently encountered in compressed headers. For example, data block headers may use a special "copy previous" code to compress contiguous code lengths into a single token. Such code lengths take multiple cycles to process in a conventional implementation. Writing multiple code lengths concurrently to a code length array may generally involve use of a multi-ported register or a highly banked storage macro that not only incurs significant logic overhead but also results in performance loss due to the increased critical path depth to handle the worst case scenario. Various embodiments herein leverage the ability of a repeating code length sequence to be concurrently written at the desired locations in a register file array (e.g., a bank of memory 500) by enabling multiple wordlines of the bank simultaneously (where each wordline stores a code length), thus eliminating the need for extra write ports. Various embodiments of the present disclosure utilize a "tagged addressing" technique to enable multiple wordlines. The tagged addressing technique may be incorporated into existing register file macros with minor modifications to the address decoders for the banks.

The embodiment depicted shows an address decoder with a 6 bit input address ($A_0$-$A_5$), a 6 bit tag associated with the address ($A_0'$-$A_5'$), and 64 outputs ($WL_0$-$WL_{63}$). In other embodiments, an address decoder may have any suitable number of inputs and outputs. The decoder includes three pre-decoders 604 (604A-604C) that are each operable to assert 1, 2, 3, or 4 outputs. Also shown is a pre-decoder 602 that is operable to assert only a single output (this pre-decoder 602 is not part of the illustrated decoder but rather is depicted for explanatory purposes only). The pre-decoder 602 may be used in a scheme in which only a single wordline output is to be enabled by a decoder.

In addition to two address bits (A and B), a pre-decoder 604 also receives two tag bits (A' and B'), where A' is associated with A, and B' is associated with B. A tag bit operates to convert its associated address bit into a "don't care" value. Accordingly, if A' is set and B' is set, then all outputs of pre-decoder 604 are enabled. If A' is set, then two of the outputs will be enabled (based on the value of B). Similarly, if B' is set, then two of the outputs will be enabled (based on the value of A). If neither A' nor B' is set, then one of the outputs will go high based on the values of A and B (similar to pre-decoder 602).

The outputs of the pre-decoders 604 are fed to corresponding switching blocks 606 (e.g., 606A-606C). Each switching block 606 couples an output of a pre-decoder to multiple output stages 608. Each output stage 608 receives one output from each pre-decoder (via the switching blocks 606) and no output stage 608 receives the same combination of pre-decoder outputs, and each unique combination of three outputs, including one output from each pre-decoder, is coupled to one of the output stages 608. Each output stage 608 determines whether to assert its associated wordline based on the input values it receives. Example logic is depicted for the pre-decoders 604 and output stages 608, though other embodiments may use any suitable logic.

Thus, various embodiments may include a range tag generated in conjunction with a given address to copy the same data to multiple locations (e.g., wordlines) in a storage array (e.g., register-file, look-up table, or SRAM) in a single cycle. In contrast to a traditional write scheme where only one wordline is enabled, the range tag operates as a set of "don't care" bits that mask a given address using a pre-decoding scheme, thus enabling multiple wordlines during a single clock cycle. As an additional example, an address of 110000 with a tag set to 000111, enables $WL_{48}$, $WL_{49}$ ... $WL_{55}$, thus writing the data applied to the bitlines of the memory to 8 locations simultaneously. This tagged addressing technique can be incorporated into compiler generated macros with little modification to the peripheral address decoders, without modification to the memory array used to store the values. In some embodiments, the multi-write scheme described herein may be used in conjunction with the code skipping scheme described herein. For example, if the header indicates a number of consecutive zero-length codes that is greater than the size of a bank, the relevant bank may be disabled using the associated vector bit and multiple code length entries of the preceding and/or successive bank may be simultaneously written to zero using a multi-write scheme utilizing an address and associated tag (based on which particular code lengths are zero) or multiple addresses and tags.

Figure 7:
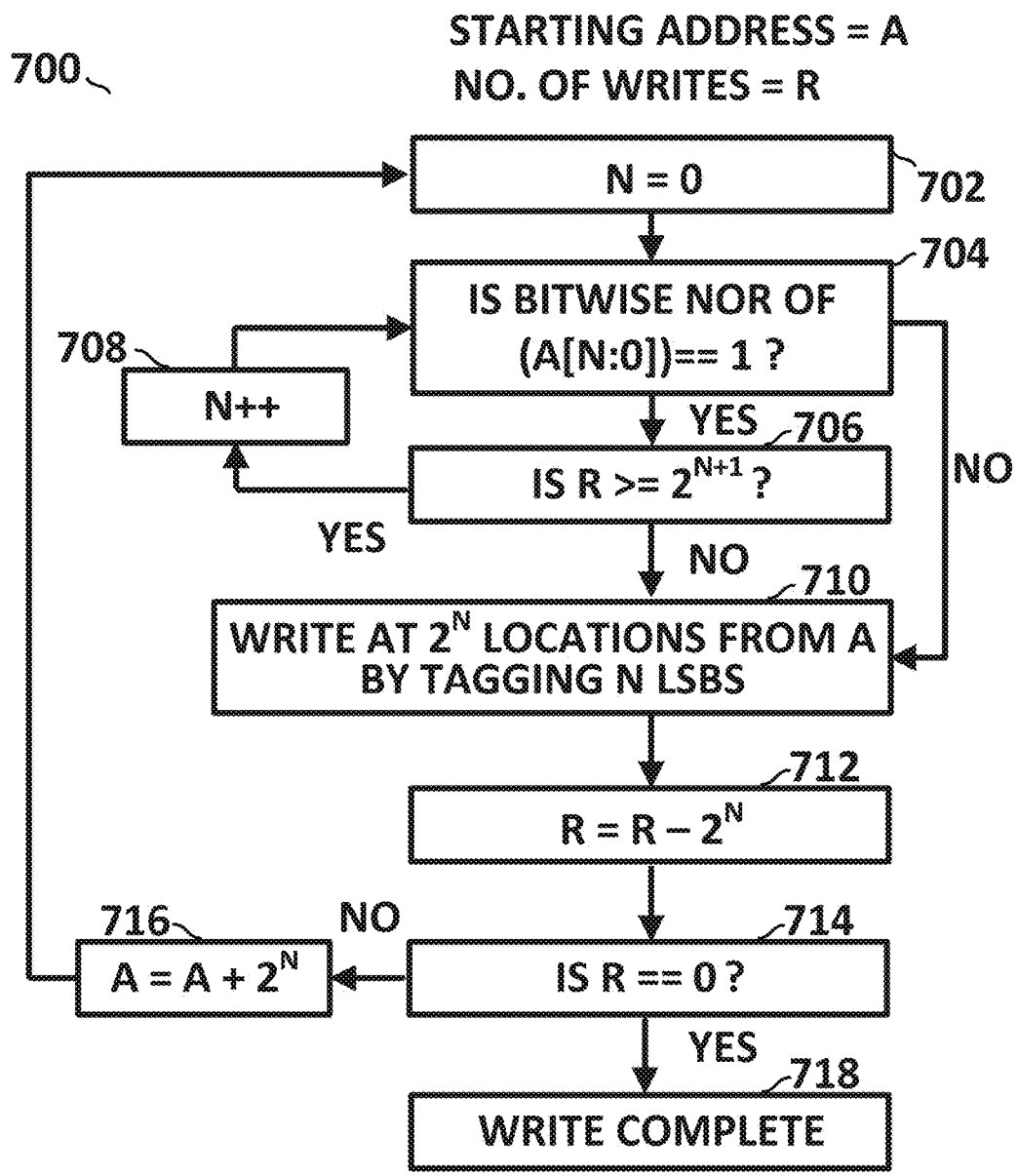
FIG. 7 illustrates an example flow for issuing code length memory writes in accordance with certain embodiments.

FIG. 7 illustrates an example flow 700 for issuing code length memory writes in accordance with certain embodiments. In various embodiments, the flow may be performed by the prefix decoder engine 104 to implement a multi-write scheme as described herein. The flow may reduce the latency to parse a "copy code" (i.e., a code representing a consecutive number of code lengths with a common value) given a starting address and the number of replications required. In addition to copying previous codes, the flow may also be used to accelerate a parsing sequence of non-existing codes (e.g., in DEFLATE a zero-length code may repeat up to 138 times).

The flow determines how writes to R consecutive locations should be performed, given a starting address of A (e.g., A may be the address where the next parsed code length is to be stored in memory 500). Using the decoder illustrated in FIG. 6 (or other similar multi-write enabling decoder), a number of locations (e.g., wordlines) that is a power of 2 (e.g., 2, 4, 8, 16, 32, or 64 consecutive locations) may be written to simultaneously. However, care must be taken to write along the proper address boundaries to ensure that previously written valid code lengths are not overwritten by a multi-write operation.

At 702, a counter N is initialized to 0. At 704, a determination is made as to whether each of the N least significant bits of A are 0 (e.g., by performing a bitwise NOR operation on the N least significant bits of A and determining whether the result is equal to 1). If each of the N least significant bits of A are 0, the flow moves to 706. If each of the N least significant bits of A are not all equal to zero, the flow moves to 710. At 706, it is determined whether R greater than or equal to $2^{N+1}$. If R is greater than or equal to $2^{N+1}$, the flow moves 708, where N is incremented.

At 710, a write is performed at $2^N$ locations from the starting address A by tagging the N least significant bits. That is, the N least significant bits of the tag illustrated in FIG. 6 are set. For example, if N is 4, then $A_0'$ through $A_3'$ are set while $A_4'$ and $A_5'$ are not set. At 712, R is updated by subtracting the number of locations written to at 712 (i.e., $2^N$) to determine how many writes remain. At 714, a determination is made as to whether R equals zero. If it does, the write is completed and flow ends at 718. If R does not equal zero, the starting address A is updated by adding the number of writes made at 710 to the starting address (i.e., A=A +$2^N$). The flow then returns to 702 to process any remaining writes.

In essence, flow 700 monitors the current address and determines the maximum number of successive addresses (that is less than the number of writes that need to be performed) that may be written to simultaneously based on the starting address without overwriting previous addresses. The flow then performs the write (which may be a write to one address or to multiple addresses). The flow then again determines the maximum number of successive addresses (that is less than the number of remaining writes that need to be performed) that may be written to simultaneously based on the current address and performs the write. This flow continues until the number of writes remaining is zero.

Figure 8:
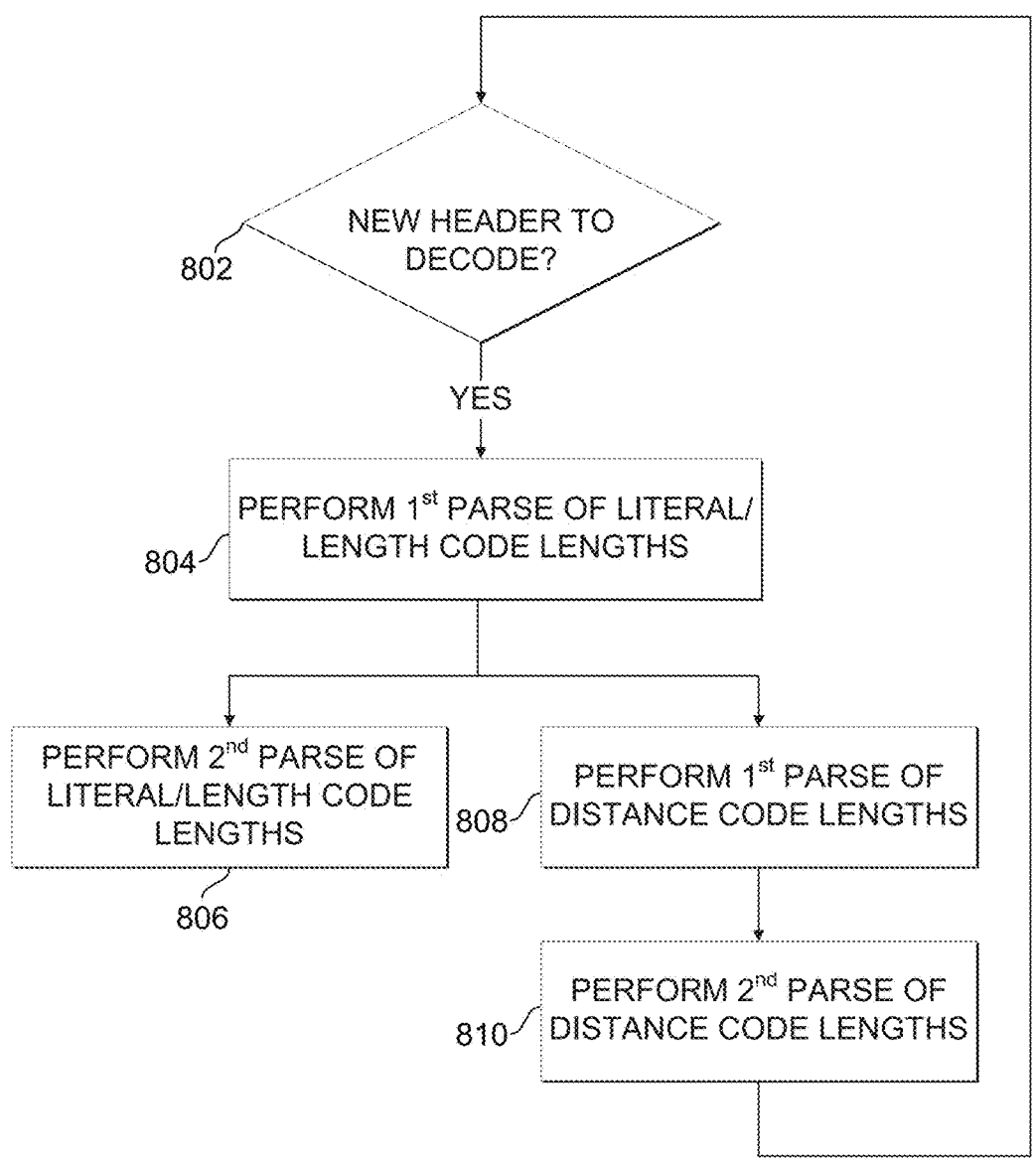
FIG. 8 illustrates an example flow for using a single prefix decoder engine to decode headers for a plurality of decompression engines.

FIG. 8 illustrates an example flow for using a single prefix decoder engine to decode headers for a plurality of decompression engines. In various embodiments, the flow may be performed by prefix decoder engine 104 and/or other suitable logic. At 802, a determination is made as to whether a new header is ready to be decoded. In various embodiments, a thread arbiter 216 may monitor multiple decompression engines 114 to determine when a decompression engine has finished decompressing a data block. When a decompression engine finishes decompressing a data block and is ready to decompress a new data block, the thread arbiter 216 may enable prefix decoder engine 104 to access a header of a new data block.

At 804, the prefix decoder engine performs a first parse of literal/length code lengths. The first parse may include determining a count for each code length of the literal/length code lengths. At 806 the prefix decoder engine performs a second parse of the literal/length code lengths in parallel with performing a first parse of distance code lengths at 808. The second parse of the literal/length code lengths may include generating codes corresponding to the code lengths and the first parse of the distance code lengths may include determining a count for each code length of the distance code lengths. At 810, the prefix decoder engine performs a second parse of the distance code lengths in which codes corresponding to the distance code lengths are generated. The flow then returns to 802 and may be repeated when a new header is available to be decoded (for example, for a different decompression engine).

Figure 9:
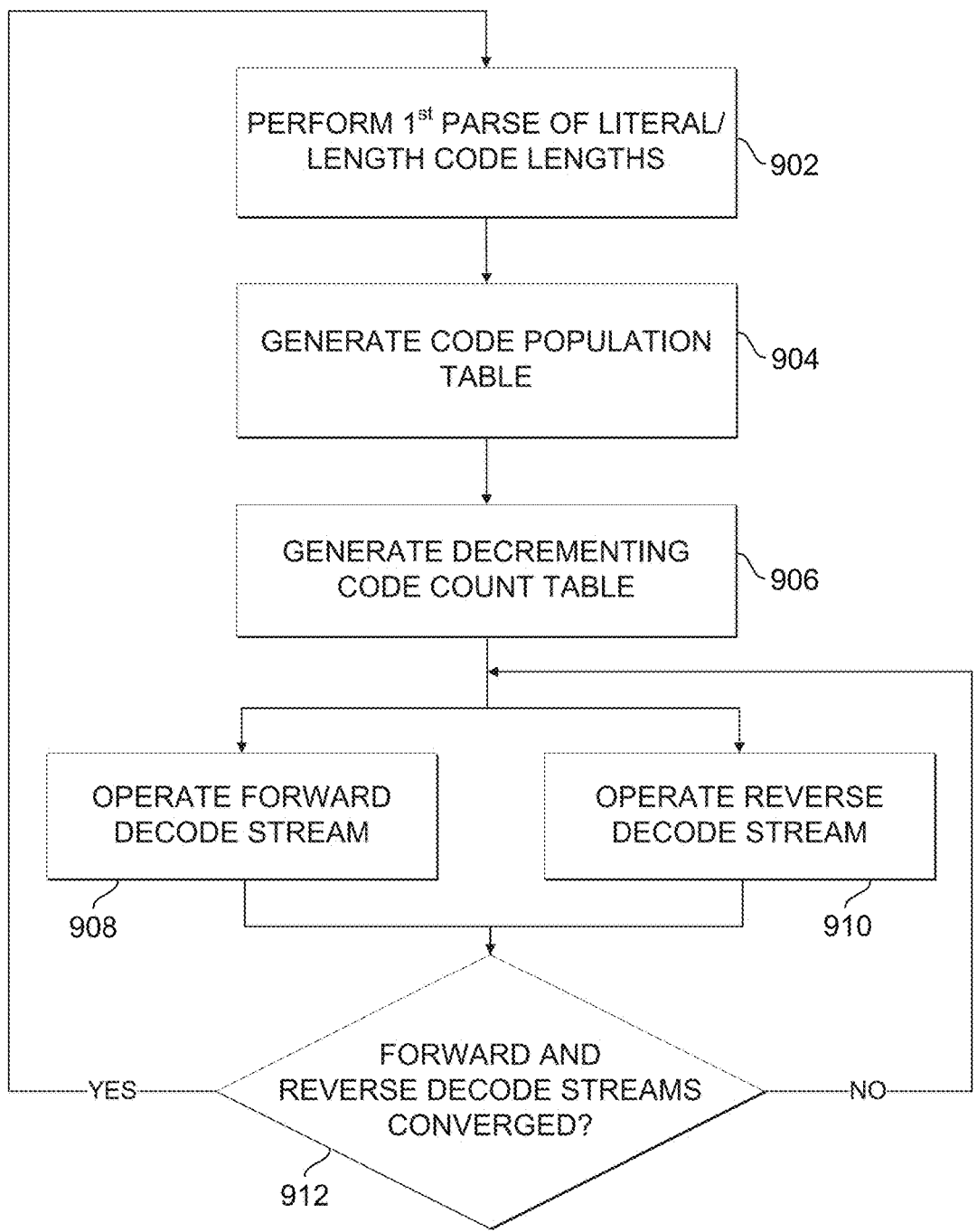
FIG. 9 illustrates an example flow for operating a forward decode stream and a reverse decode stream.

FIG. 9 illustrates an example flow for operating a forward decode stream and a reverse decode stream. In various embodiments, the flow may be performed by prefix decoder engine 104 and/or other suitable logic. At 902, a first parse of literal/length code lengths is performed. The first parse may include determining a count for each code length. At 904, a code population table is generated based on the counts obtained during the first parse. At 906, a decrementing code count table is generated. In a particular embodiment, the decrementing code count table includes the counts for each code length which were determined during the first parse. At 908 and 910, a forward decode stream is operated in parallel with a reverse decode stream. At 912, a determination is made as to whether the forward and reverse decode streams have converged (e.g., at a common index). If the streams have not converged, the forward and reverse decode streams continue to be operated. Once the forward and reverse decode streams converge, additional operations may be performed (for example, distance codes may be decoded). The flow may repeat by returning to 902 to process a new header.

Figure 10:
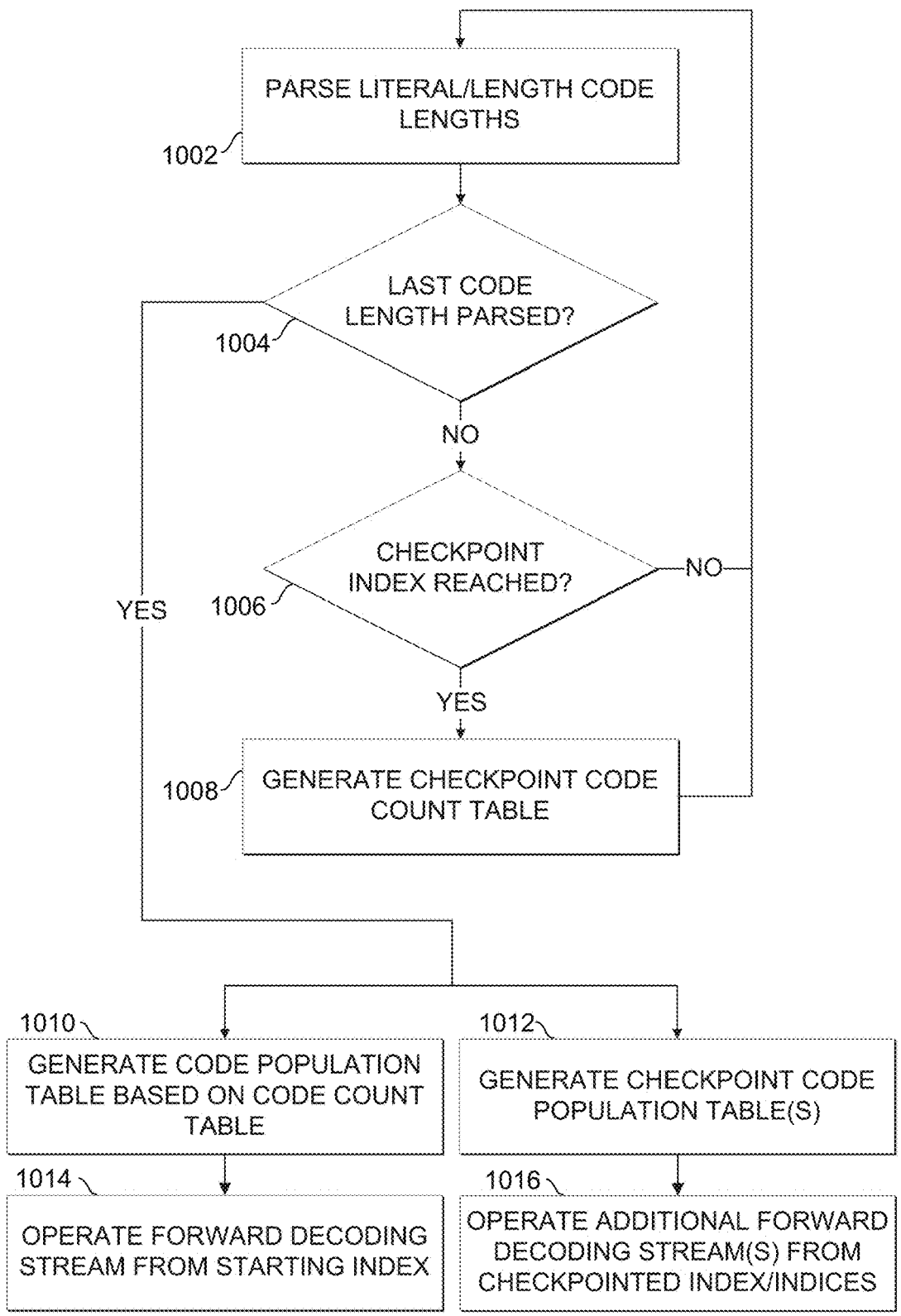
FIG. 10 illustrates an example flow for operating multiple forward decode streams in parallel.

FIG. 10 illustrates an example flow for operating multiple forward decode streams in parallel. In various embodiments, the flow may be performed by prefix decoder engine 104 and/or other suitable logic. At 1002, literal/length code lengths are parsed (for example as part of a first parse). At 1004, a determination is made as to whether the last code length has been parsed. If the last code length has been parsed, the flow moves to 1010 and 1012. If the last code has not been parsed the flow moves to 1006. At 1006, a determination is made as to whether a checkpoint index has been reached. If a checkpoint index has not been reached, the parsing continues at 1002. If a checkpoint index has been reached at 1006, a checkpoint code count table is generated at 1008. The checkpoint code count table may include the number of times each code length was encountered during the first parse up to the checkpoint index. In various embodiments, 1008 may be performed for each checkpoint index (for example, one or more checkpoint indices may be used). Once the last code length is reached, the flow moves to 1010 and 1012. At 1010, a code population table is generated based on a code count table generated during the parsing. At 1012, a checkpoint code population table is generated for each checkpoint code count table. At 1014, a forward decoding stream is operated from the starting index of the code lengths. In parallel at 1016, one or more additional forward decoding streams may be operated from the checkpointed index/indices.

The flows described in FIG. 7-10 are merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIGS. 7-10 may be repeated, combined, modified, or omitted where appropriate. Additionally, operations may be performed in any suitable order without departing from the scope of particular embodiments.

The figures below detail exemplary architectures and systems to implement embodiments of the above. In some embodiments, one or more hardware components and/or instructions described above are emulated as detailed below, or implemented as software modules.

Figure 11:
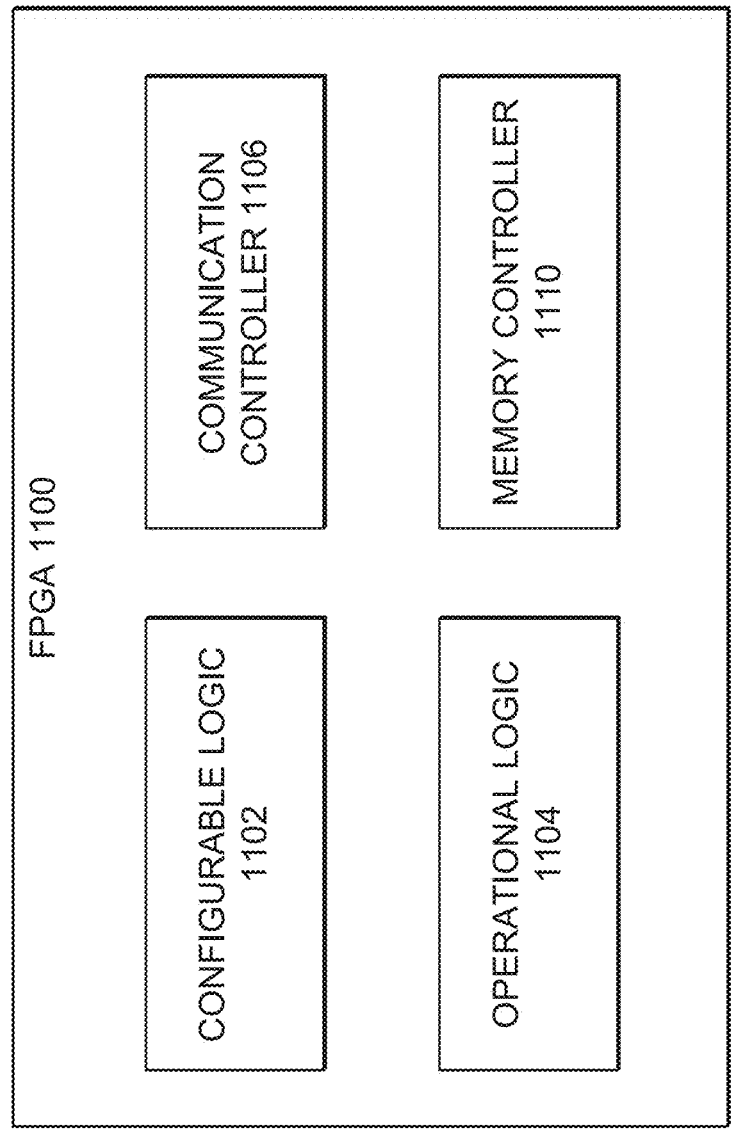
FIG. 11 illustrates an example field-programmable gate array (FPGA) in accordance with certain embodiments.

FIG. 11 illustrates an example block diagram of a field programmable gate array (FGPA) 1100 in accordance with certain embodiments. In a particular embodiment, a prefix decoder engine 104 and/or decompression engines 114 may be implemented by an FPGA 1100. An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 1100 includes configurable logic 1102, operational logic 1104, communication controller 1106, and memory controller 1110. Configurable logic 1102 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a prefix decoder engine. Some FPGAs 1100 may be limited to executing a single kernel at a time while other FPGAs may be capable of executing multiple kernels simultaneously. The configurable logic 1102 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 1104 may access a data structure defining a kernel and configure the configurable logic 1102 based on the data structure and perform other operations of the FPGA. In some embodiments, operational logic 1104 may write control bits to memory (e.g., nonvolatile flash memory or SRAM based memory) of the FPGA 1100 based on the data structure, wherein the control bits operate to configure the logic (e.g., by activating or deactivating particular interconnects between portions of the configurable logic). The operational logic 1104 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 1106 may enable FPGA 1100 to communicate with other components (e.g., a compression engine) of a computer system (e.g., to receive commands to compress data sets). Memory controller 1110 may enable the FPGA to read data (e.g., operands or results) from or write data to memory of a computer system. In various embodiments, memory controller 1110 may comprise a direct memory access (DMA) controller.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 12A is a block diagram illustrating both an exemplary in-order pipeline and an exemplary register renaming, out-of-order issue/execution pipeline according to embodiments of the disclosure. FIG. 12B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 12A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 12A, a processor pipeline 1200 includes a fetch stage 1202, a length decode stage 1204, a decode stage 1206, an allocation stage 1208, a renaming stage 1210, a scheduling (also known as a dispatch or issue) stage 1212, a register read/memory read stage 1214, an execute stage 1216, a write back/memory write stage 1218, an exception handling stage 1222, and a commit stage 1224.

FIG. 12B shows processor core 1290 including a front end unit 1230 coupled to an execution engine unit 1250, and both are coupled to a memory unit 1270. The core 1290 may be a reduced instruction set computing (RISC) core, a complex instruction set computing (CISC) core, a very long instruction word (VLIW) core, or a hybrid or alternative core type. As yet another option, the core 1290 may be a special-purpose core, such as, for example, a network or communication core, compression and/or decompression engine, coprocessor core, general purpose computing graphics processing unit (GPGPU) core, graphics core, or the like.

The front end unit 1230 includes a branch prediction unit 1232 coupled to an instruction cache unit 1234, which is coupled to an instruction translation lookaside buffer (TLB) 1236, which is coupled to an instruction fetch unit 1238, which is coupled to a decode unit 1240. The decode unit 1240 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1240 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1290 includes a microcode ROM or other medium that stores microcode for certain macroinstructions (e.g., in decode unit 1240 or otherwise within the front end unit 1230). The decode unit 1240 is coupled to a rename/allocator unit 1252 in the execution engine unit 1250.

The execution engine unit 1250 includes the rename/allocator unit 1252 coupled to a retirement unit 1254 and a set of one or more scheduler unit(s) 1256. The scheduler unit(s) 1256 represents any number of different schedulers, including reservations stations, central instruction window, etc. The scheduler unit(s) 1256 is coupled to the physical register file(s) unit(s) 1258. Each of the physical register file(s) units 1258 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1258 comprises a vector registers unit, a write mask registers unit, and a scalar registers unit. These register units may provide architectural vector registers, vector mask registers, and general purpose registers. The physical register file(s) unit(s) 1258 is overlapped by the retirement unit 1254 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1254 and the physical register file(s) unit(s) 1258 are coupled to the execution cluster(s) 1260. The execution cluster(s) 1260 includes a set of one or more execution units 1262 and a set of one or more memory access units 1264. The execution units 1262 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1256, physical register file(s) unit(s) 1258, and execution cluster(s) 1260 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1264). It should also be understood that where separate pipelines are used, one or more of these pipelines may be out-of-order issue/execution and the rest in-order.

The set of memory access units 1264 is coupled to the memory unit 1270, which includes a data TLB unit 1272 coupled to a data cache unit 1274 coupled to a level 2 (L2) cache unit 1276. In one exemplary embodiment, the memory access units 1264 may include a load unit, a store address unit, and a store data unit, each of which is coupled to the data TLB unit 1272 in the memory unit 1270. The instruction cache unit 1234 is further coupled to a level 2 (L2) cache unit 1276 in the memory unit 1270. The L2 cache unit 1276 is coupled to one or more other levels of cache and eventually to a main memory.

By way of example, the exemplary register renaming, out-of-order issue/execution core architecture may implement the pipeline 1200 as follows: 1) the instruction fetch 1238 performs the fetch and length decoding stages 1202 and 1204; 2) the decode unit 1240 performs the decode stage 1206; 3) the rename/allocator unit 1252 performs the allocation stage 1208 and renaming stage 1210; 4) the scheduler unit(s) 1256 performs the schedule stage 1212; 5) the physical register file(s) unit(s) 1258 and the memory unit 1270 perform the register read/memory read stage 1214; the execution cluster 1260 perform the execute stage 1216; 6) the memory unit 1270 and the physical register file(s) unit(s) 1258 perform the write back/memory write stage 1218; 7) various units may be involved in the exception handling stage 1222; and 8) the retirement unit 1254 and the physical register file(s) unit(s) 1258 perform the commit stage 1224.

The core 1290 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1290 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1234/1274 and a shared L2 cache unit 1276, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 13B:
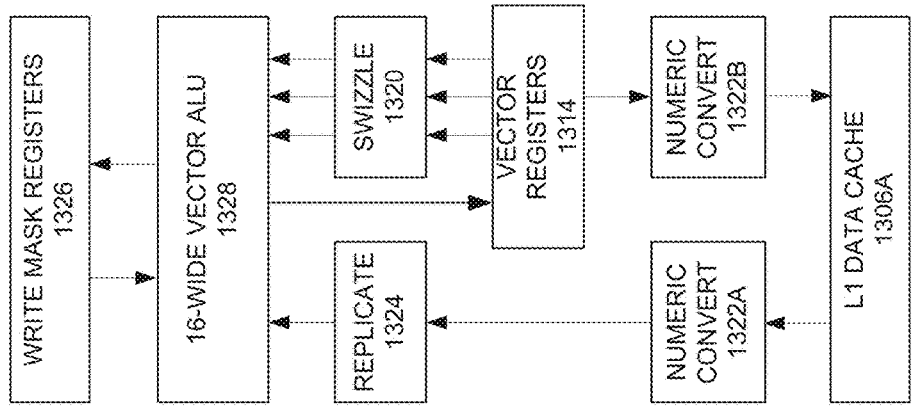
FIGS. 13A-B illustrate a block diagram of a more specific exemplary in-order core architecture, which core would be one of several logic blocks (potentially including other cores of the same type and/or different types) in a chip in accordance with certain embodiments.
Figure 13A:
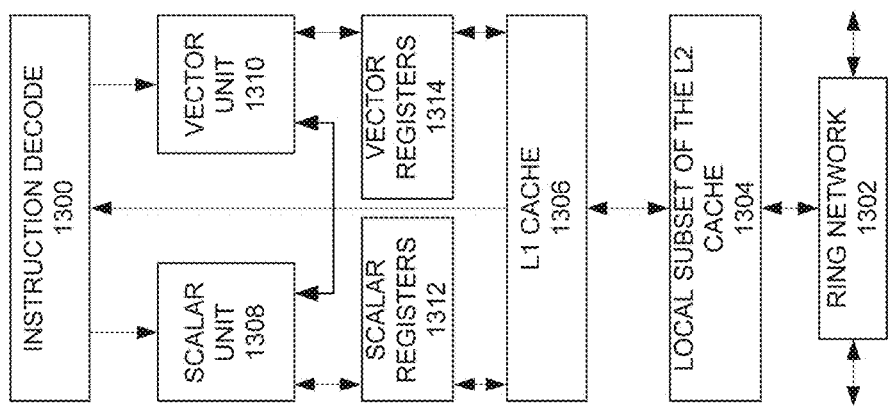

FIGS. 13A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 13A is a block diagram of a single processor core, along with its connection to the on-die interconnect network 1302 and with its local subset of the Level 2 (L2) cache 1304, according to various embodiments. In one embodiment, an instruction decoder 1300 supports the x86 instruction set with a packed data instruction set extension. An L1 cache 1306 allows low-latency accesses to cache memory into the scalar and vector units. While in one embodiment (to simplify the design), a scalar unit 1308 and a vector unit 1310 use separate register sets (respectively, scalar registers 1312 and vector registers 1314) and data transferred between them is written to memory and then read back in from a level 1 (L1) cache 1306, alternative embodiments may use a different approach (e.g., use a single register set or include a communication path that allow data to be transferred between the two register files without being written and read back).

The local subset of the L2 cache 1304 is part of a global L2 cache that is divided into separate local subsets (in some embodiments one per processor core). Each processor core has a direct access path to its own local subset of the L2 cache 1304. Data read by a processor core is stored in its L2 cache subset 1304 and can be accessed quickly, in parallel with other processor cores accessing their own local L2 cache subsets. Data written by a processor core is stored in its own L2 cache subset 1304 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 13B is an expanded view of part of the processor core in FIG. 13A according to embodiments. FIG. 13B includes an L1 data cache 1306A (part of the L1 cache 1306), as well as more detail regarding the vector unit 1310 and the vector registers 1314. Specifically, the vector unit 1310 is a 16-wide vector processing unit (VPU) (see the 16-wide ALU 1328), which executes one or more of integer, single-precision float, and double-precision float instructions. The VPU supports swizzling the register inputs with swizzle unit 1320, numeric conversion with numeric convert units 1322A-B, and replication with replication unit 1324 on the memory input. Write mask registers 1326 allow predicating resulting vector writes.

Figure 14:
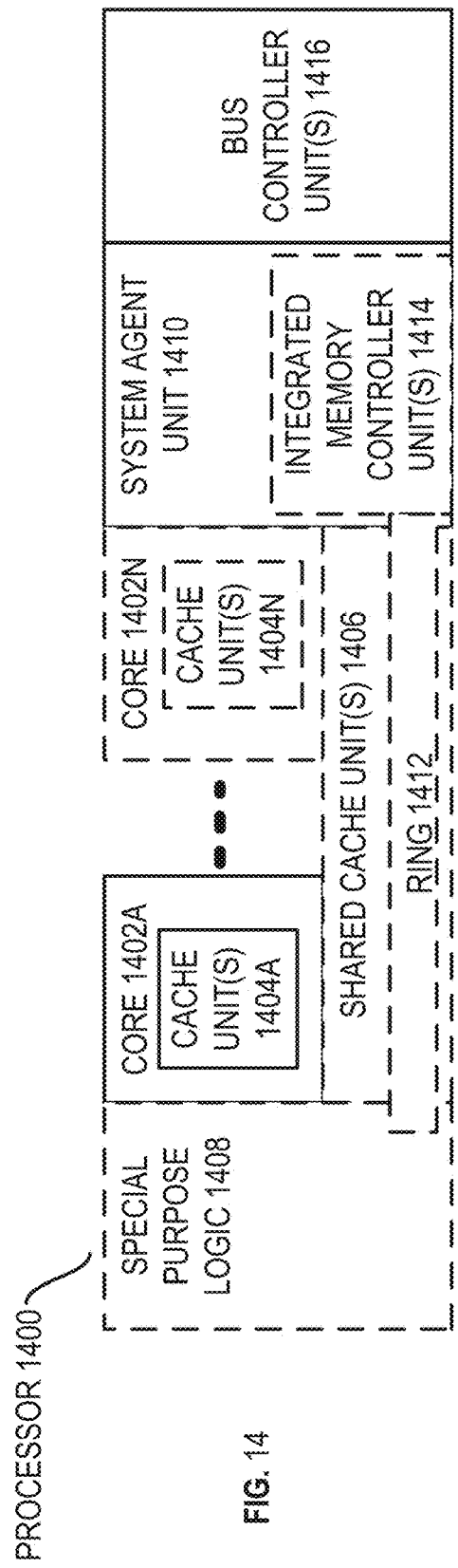
FIG. 14 is a block diagram of a processor that may have more than one core, may have an integrated memory controller, and may have integrated graphics in accordance with certain embodiments.

FIG. 14 is a block diagram of a processor 1400 that may have more than one core, may have an integrated memory controller, and may have integrated graphics according to various embodiments. The solid lined boxes in FIG. 14 illustrate a processor 1400 with a single core 1402A, a system agent 1410, and a set of one or more bus controller units 1416; while the optional addition of the dashed lined boxes illustrates an alternative processor 1400 with multiple cores 1402A-N, a set of one or more integrated memory controller unit(s) 1414 in the system agent unit 1410, and special purpose logic 1408.

Thus, different implementations of the processor 1400 may include: 1) a CPU with the special purpose logic 1408 being integrated graphics and/or scientific (throughput) logic (which may include one or more cores), and the cores 1402A-N being one or more general purpose cores (e.g., general purpose in-order cores, general purpose out-of-order cores, or a combination of the two); 2) a coprocessor with the cores 1402A-N being a large number of special purpose cores intended primarily for graphics and/or scientific (throughput); and 3) a coprocessor with the cores 1402A-N being a large number of general purpose in-order cores. Thus, the processor 1400 may be a general-purpose processor, coprocessor or special-purpose processor, such as, for example, a network or communication processor, compression and/or decompression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 1400 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 1406, and external memory (not shown) coupled to the set of integrated memory controller units 1414. The set of shared cache units 1406 may include one or more mid-level caches, such as level 2 (L2), level 3 (L3), level 4 (L4), or other levels of cache, a last level cache (LLC), and/or combinations thereof. While in one embodiment a ring based interconnect unit 1412 interconnects the special purpose logic (e.g., integrated graphics logic) 1408, the set of shared cache units 1406, and the system agent unit 1410/integrated memory controller unit(s) 1414, alternative embodiments may use any number of well-known techniques for interconnecting such units. In one embodiment, coherency is maintained between one or more cache units 1406 and cores 1402A-N.

In some embodiments, one or more of the cores 1402A-N are capable of multithreading. The system agent 1410 includes those components coordinating and operating cores 1402A-N. The system agent unit 1410 may include for example a power control unit (PCU) and a display unit. The PCU may be or include logic and components needed for regulating the power state of the cores 1402A-N and the special purpose logic 1408. The display unit is for driving one or more externally connected displays.

The cores 1402A-N may be homogenous or heterogeneous in terms of architecture instruction set; that is, two or more of the cores 1402A-N may be capable of executing the same instruction set, while others may be capable of executing only a subset of that instruction set or a different instruction set.

FIGS. 15-18 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 15:
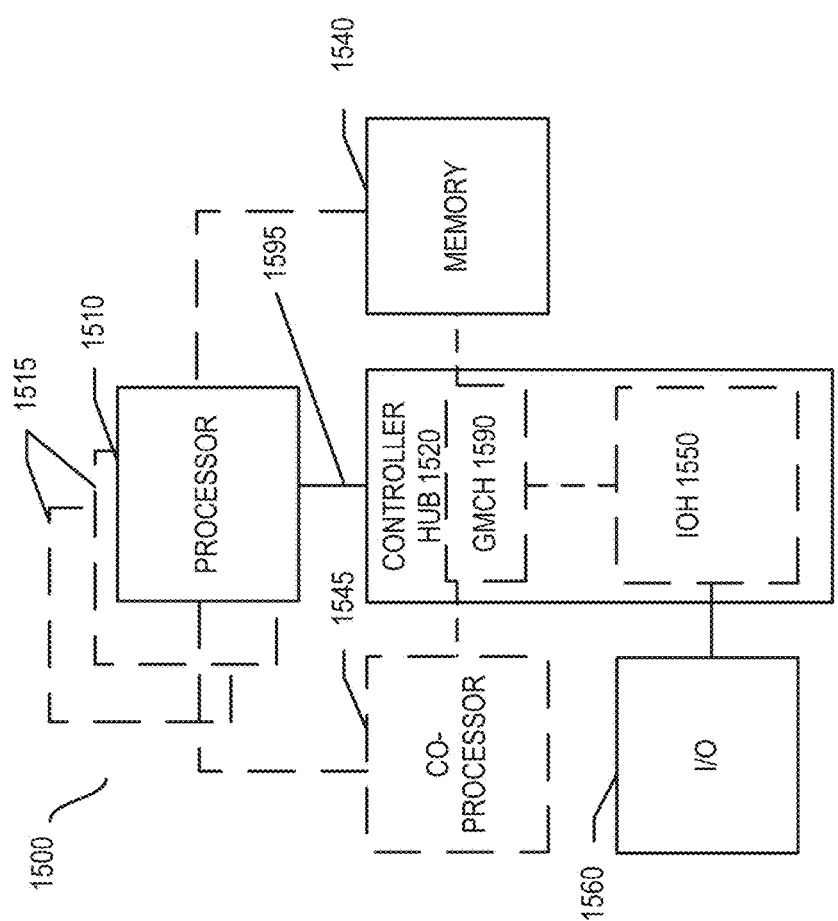
FIGS. 15, 16, 17, and 18 are block diagrams of exemplary computer architectures in accordance with certain embodiments.

FIG. 15 depicts a block diagram of a system 1500 in accordance with one embodiment of the present disclosure. The system 1500 may include one or more processors 1510, 1515, which are coupled to a controller hub 1520. In one embodiment, the controller hub 1520 includes a graphics memory controller hub (GMCH) 1590 and an Input/Output Hub (IOH) 1550 (which may be on separate chips or the same chip); the GMCH 1590 includes memory and graphics controllers coupled to memory 1540 and a coprocessor 1545; the IOH 1550 couples input/output (I/O) devices 1560 to the GMCH 1590. Alternatively, one or both of the memory and graphics controllers are integrated within the processor (as described herein), the memory 1540 and the coprocessor 1545 are coupled directly to the processor 1510, and the controller hub 1520 is a single chip comprising the IOH 1550.

The optional nature of additional processors 1515 is denoted in FIG. 15 with broken lines. Each processor 1510, 1515 may include one or more of the processing cores described herein and may be some version of the processor 1400.

The memory 1540 may be, for example, dynamic random access memory (DRAM), phase change memory (PCM), other suitable memory, or any combination thereof. The memory 1540 may store any suitable data, such as data used by processors 1510, 1515 to provide the functionality of computer system 1500. For example, data associated with programs that are executed or files accessed by processors 1510, 1515 may be stored in memory 1540. In various embodiments, memory 1540 may store data and/or sequences of instructions that are used or executed by processors 1510, 1515.

In at least one embodiment, the controller hub 1520 communicates with the processor(s) 1510, 1515 via a multi-drop bus, such as a frontside bus (FSB), point-to-point interface such as QuickPath Interconnect (QPI), or similar connection 1595.

In one embodiment, the coprocessor 1545 is a special-purpose processor, such as, for example, a high-throughput MIC processor, a network or communication processor, compression and/or decompression engine, graphics processor, GPGPU, embedded processor, or the like. In one embodiment, controller hub 1520 may include an integrated graphics accelerator.

There can be a variety of differences between the physical resources 1510, 1515 in terms of a spectrum of metrics of merit including architectural, microarchitectural, thermal, power consumption characteristics, and the like.

In one embodiment, the processor 1510 executes instructions that control data processing operations of a general type. Embedded within the instructions may be coprocessor instructions. The processor 1510 recognizes these coprocessor instructions as being of a type that should be executed by the attached coprocessor 1545. Accordingly, the processor 1510 issues these coprocessor instructions (or control signals representing coprocessor instructions) on a coprocessor bus or other interconnect, to coprocessor 1545. Coprocessor(s) 1545 accept and execute the received coprocessor instructions.

Figure 16:
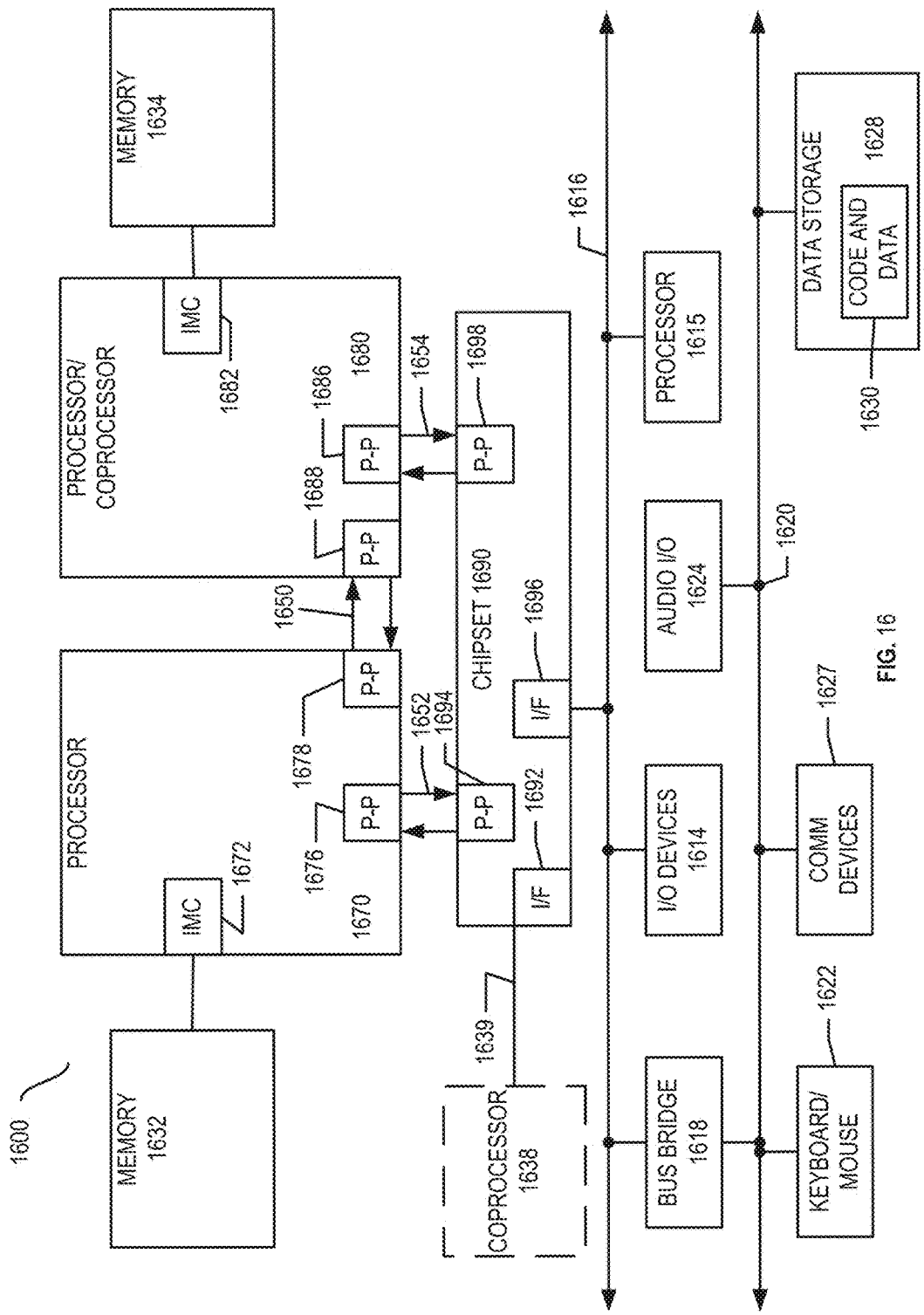

FIG. 16 depicts a block diagram of a first more specific exemplary system 1600 in accordance with an embodiment of the present disclosure. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of the processor 1400. In one embodiment of the disclosure, processors 1670 and 1680 are respectively processors 1510 and 1515, while coprocessor 1638 is coprocessor 1545. In another embodiment, processors 1670 and 1680 are respectively processor 1510 and coprocessor 1545.

Processors 1670 and 1680 are shown including integrated memory controller (IMC) units 1672 and 1682, respectively. Processor 1670 also includes as part of its bus controller unit's point-to-point (P-P) interfaces 1676 and 1678; similarly, second processor 1680 includes P-P interfaces 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors.

Processors 1670, 1680 may each exchange information with a chipset 1690 via individual P-P interfaces 1652, 1654 using point to point interface circuits 1676, 1694, 1686, 1698. Chipset 1690 may optionally exchange information with the coprocessor 1638 via a high-performance interface 1639. In one embodiment, the coprocessor 1638 is a special-purpose processor, such as, for example, a high-throughput MIC processor, a network or communication processor, compression and/or decompression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 1690 may be coupled to a first bus 1616 via an interface 1696. In one embodiment, first bus 1616 may be a Peripheral Component Interconnect (PCI) bus, or a bus such as a PCI Express bus or another third generation I/O interconnect bus, although the scope of the present disclosure is not so limited.

As shown in FIG. 16, various I/O devices 1614 may be coupled to first bus 1616, along with a bus bridge 1618 which couples first bus 1616 to a second bus 1620. In one embodiment, one or more additional processor(s) 1615, such as coprocessors, high-throughput MIC processors, GPGPU's, accelerators (such as, e.g., graphics accelerators or digital signal processing (DSP) units), field programmable gate arrays, or any other processor, are coupled to first bus 1616. In one embodiment, second bus 1620 may be a low pin count (LPC) bus. Various devices may be coupled to a second bus 1620 including, for example, a keyboard and/or mouse 1622, communication devices 1627 and a storage unit 1628 such as a disk drive or other mass storage device which may include instructions/code and data 1630, in one embodiment. Further, an audio I/O 1624 may be coupled to the second bus 1620. Note that other architectures are contemplated by this disclosure. For example, instead of the point-to-point architecture of FIG. 16, a system may implement a multi-drop bus or other such architecture.

Figure 17:
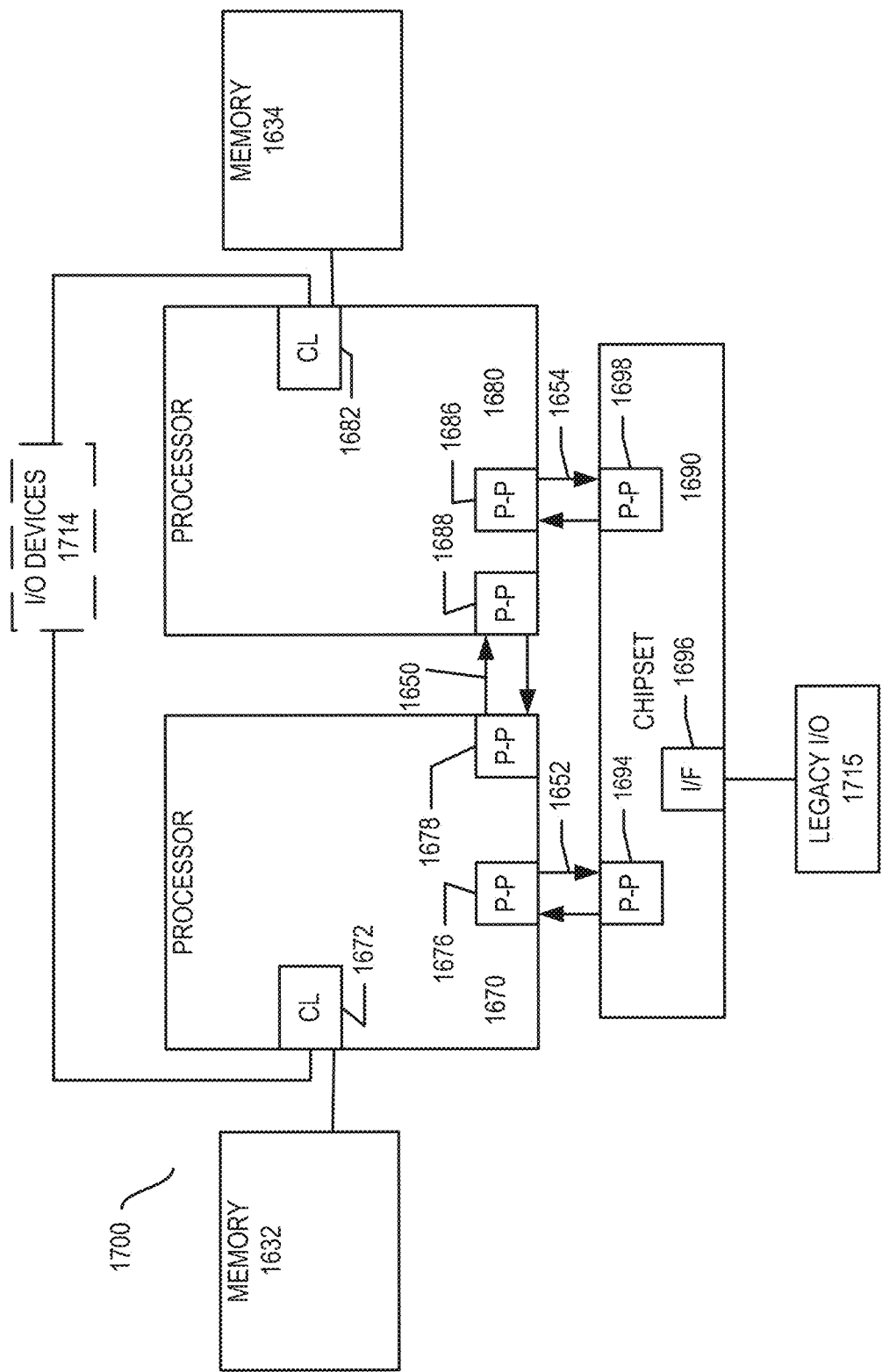

FIG. 17 depicts a block diagram of a second more specific exemplary system 1700 in accordance with an embodiment of the present disclosure. Similar elements in FIGS. 16 and 17 bear similar reference numerals, and certain aspects of FIG. 16 have been omitted from FIG. 17 in order to avoid obscuring other aspects of FIG. 17.

FIG. 17 illustrates that the processors 1670, 1680 may include integrated memory and I/O control logic ("CL") 1672 and 1682, respectively. Thus, the CL 1672, 1682 include integrated memory controller units and include I/O control logic. FIG. 17 illustrates that not only are the memories 1632, 1634 coupled to the CL 1672, 1682, but also that I/O devices 1714 are also coupled to the control logic 1672, 1682. Legacy I/O devices 1715 are coupled to the chipset 1690.

Figure 18:
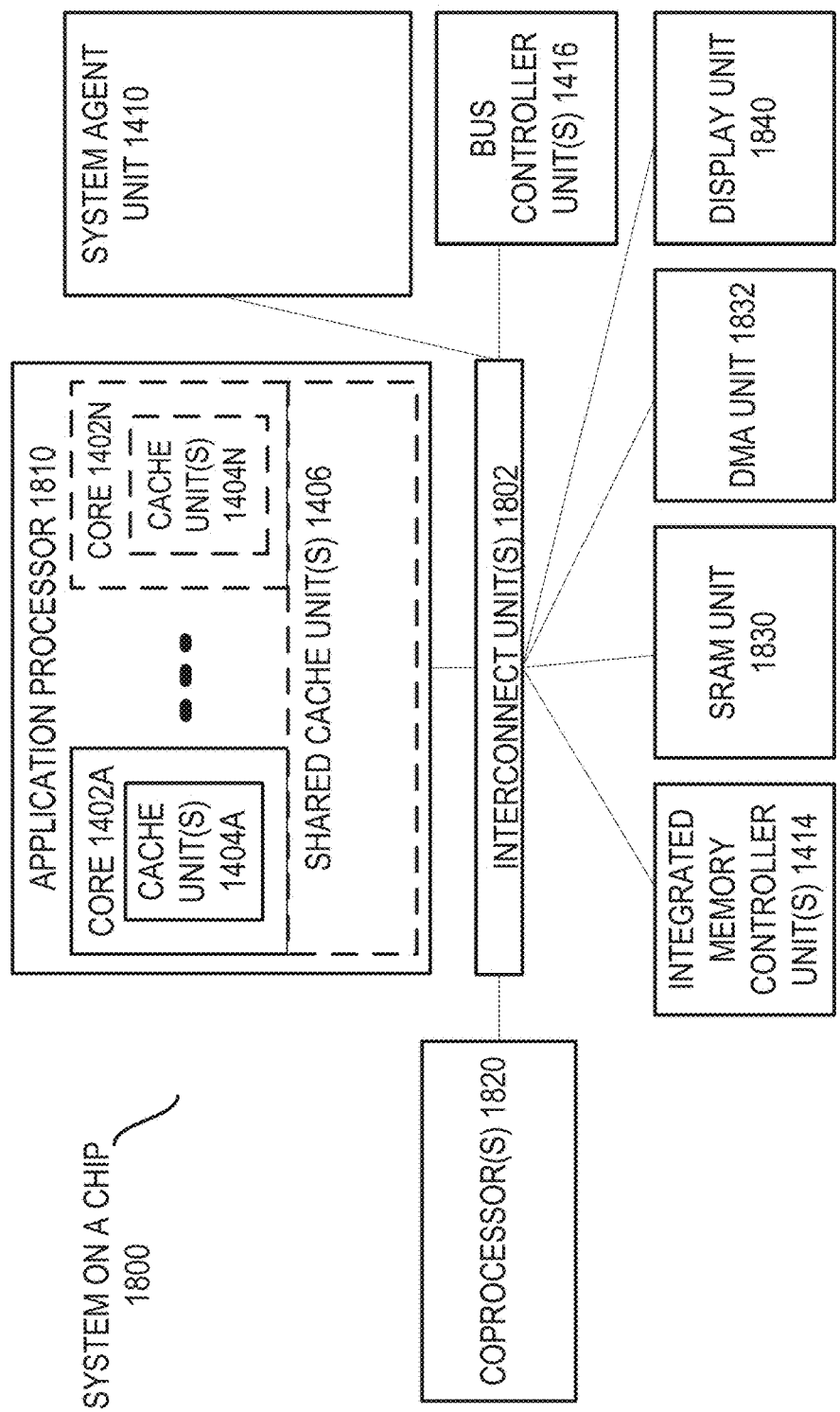

FIG. 18 depicts a block diagram of a SoC 1800 in accordance with an embodiment of the present disclosure. Similar elements in FIG. 14 bear similar reference numerals. Also, dashed lined boxes are optional features on more advanced SoCs. In FIG. 18, an interconnect unit(s) 1802 is coupled to: an application processor 1810 which includes a set of one or more cores 1402A-N and shared cache unit(s) 1406; a system agent unit 1410; a bus controller unit(s) 1416; an integrated memory controller unit(s) 1414; a set or one or more coprocessors 1820 which may include integrated graphics logic, an image processor, an audio processor, and a video processor; an static random access memory (SRAM) unit 1830; a direct memory access (DMA) unit 1832; and a display unit 1840 for coupling to one or more external displays. In one embodiment, the coprocessor(s) 1820 include a special-purpose processor, such as, for example, a network or communication processor, compression and/or decompression engine, GPGPU, a high-throughput MIC processor, embedded processor, or the like.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 19 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 19 shows a program in a high level language 1902 may be compiled using an x86 compiler 1904 to generate x86 binary code 1906 that may be natively executed by a processor with at least one x86 instruction set core 1916. The processor with at least one x86 instruction set core 1916 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1904 represents a compiler that is operable to generate x86 binary code 1906 (e.g., object code) that can, with or without additional linkage processing, be executed on the processor with at least one x86 instruction set core 1916. Similarly, FIG. 19 shows the program in the high level language 1902 may be compiled using an alternative instruction set compiler 1908 to generate alternative instruction set binary code 1910 that may be natively executed by a processor without at least one x86 instruction set core 1914 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1912 is used to convert the x86 binary code 1906 into code that may be natively executed by the processor without an x86 instruction set core 1914. This converted code is not likely to be the same as the alternative instruction set binary code 1910 because an instruction converter capable of this is difficult to make; however, the converted code will accomplish the general operation and be made up of instructions from the alternative instruction set. Thus, the instruction converter 1912 represents software, firmware, hardware, or a combination thereof that, through emulation, simulation or any other process, allows a processor or other electronic device that does not have an x86 instruction set processor or core to execute the x86 binary code 1906.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1630 illustrated in FIG. 16, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the flows or functionality of the various components such as processor 100, cores 102, prefix decoder engine 104, decompression engines 114, thread arbiter 216, residual bits concatenation logic 214, forward decode streams, reverse decode streams, memory 500, predecoder 604 or other components of the illustrated decoder, FPGA 1100, other component described herein, or any subcomponent of any of these components. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a memory; a processor; and a prefix decoder engine to access a plurality of code lengths of a header associated with a compressed data block; determine a number of instances of each code length of at least some of the plurality of code lengths; and operate a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

In an embodiment, the plurality of decode streams comprises a first decode stream that is to iterate in a forward direction through the first portion of the plurality of code lengths and a second decode stream that is to iterate in a reverse direction through the second portion of the plurality of code lengths. In an embodiment, the plurality of decode streams comprises a first decode stream that is to iterate in a forward direction through the first portion of the plurality of code lengths and a second decode stream that is to iterate in a forward direction through the second portion of the plurality of code lengths. In an embodiment, the plurality of decode streams comprises three or more decode streams. In an embodiment, the prefix decoder engine is to determine that a plurality of consecutive code lengths of the header are the same value; and simultaneously write the code lengths to a plurality of wordlines of the memory. In an embodiment, the prefix decoder engine is to provide an address and a corresponding tag to the memory to enable the memory to determine a plurality of wordlines to be enabled during a single write operation to write the plurality of consecutive code lengths to the plurality of wordlines of the memory. In an embodiment, the prefix decoder engine is to disable a bank of the memory based on a determination that a plurality of consecutive code lengths of the header each have a value of zero. In an embodiment, the apparatus further comprises a plurality of decompression engines each operable to decompress a payload based on codes decoded by the prefix decoder engine. In an embodiment, the codes are Huffman codes used to encode a DEFLATE payload. In an embodiment, the apparatus further comprises a battery communicatively coupled to a processor, a display communicatively coupled to the processor, or a network interface communicatively coupled to the processor.

In at least one embodiment, a method comprises accessing a plurality of code lengths of a header associated with a compressed data block; determining a number of instances of each code length of at least some of the plurality of code lengths; and operating a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

In an embodiment, the plurality of decode streams comprises a first decode stream that is to iterate in a forward direction through the first portion of the plurality of code lengths and a second decode stream that is to iterate in a reverse direction through the second portion of the plurality of code lengths. In an embodiment, the plurality of decode streams further comprises a first decode stream that is to iterate in a forward direction through the first portion of the plurality of code lengths and a second decode stream that is to iterate in a forward direction through the second portion of the plurality of code lengths. In an embodiment, the plurality of decode streams comprises three or more decode streams. In an embodiment, the method further comprises determining that a plurality of consecutive code lengths of the header are the same value; and simultaneously writing the code lengths to a plurality of wordlines of a memory. In an embodiment, the prefix decoder engine is to provide an address and a corresponding tag to a memory to enable the memory to determine a plurality of wordlines to be enabled during a single write operation to write the plurality of consecutive code lengths to the plurality of wordlines of the memory. In an embodiment, the method further comprises disabling a bank of a memory based on a determination that a plurality of consecutive code lengths of the header each have a value of zero. In an embodiment, the method further comprises decompressing payloads by a plurality of decompression engines that are each operable decompress payloads based on codes decoded by a prefix decoder engine. In an embodiment, the codes are Huffman codes used to encode a DEFLATE payload.

In at least one embodiment, a system comprises means for accessing a plurality of code lengths of a header associated with a compressed data block; means for determining a number of instances of each code length of at least some of the plurality of code lengths; and means for operating a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

In an embodiment, the plurality of decode streams comprises a first decode stream that is to iterate in a forward direction through the first portion of the plurality of code lengths and a second decode stream that is to iterate in a reverse direction through the second portion of the plurality of code lengths. In an embodiment, the plurality of decode streams comprises a first decode stream that is to iterate in a forward direction through the first portion of the plurality of code lengths and a second decode stream that is to iterate in a forward direction through the second portion of the plurality of code lengths. In an embodiment, the system further comprises means for determining that a plurality of consecutive code lengths of the header are the same value; and means for simultaneously writing the code lengths to a plurality of wordlines of a memory. In an embodiment, the system further comprises means for disabling a bank of a memory based on a determination that a plurality of consecutive code lengths of the header each have a value of zero.

In at least one embodiment, at least one machine readable storage medium comprises instructions stored thereon, the instructions when executed by a machine to cause the machine to access a plurality of code lengths of a header associated with a compressed data block; determine a number of instances of each code length of at least some of the plurality of code lengths; and operate a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

In an embodiment, the plurality of decode streams comprises a first decode stream that is to iterate in a forward direction through the first portion of the plurality of code lengths and a second decode stream that is to iterate in a reverse direction through the second portion of the plurality of code lengths. In an embodiment, the plurality of decode streams comprises a first decode stream that is to iterate in a forward direction through the first portion of the plurality of code lengths and a second decode stream that is to iterate in a forward direction through the second portion of the plurality of code lengths. In an embodiment, the instructions when executed are to cause the machine to determine that a plurality of consecutive code lengths of the header are the same value; and simultaneously write the code lengths to a plurality of wordlines of a memory. In an embodiment, the instructions when executed are to cause the machine to disable a bank of a memory based on a determination that a plurality of consecutive code lengths of the header each have a value of zero.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a memory;
a processor; and
a prefix decoder engine to:
access a plurality of code lengths of a header associated with a compressed data block;
determine a number of instances of each code length of at least some of the plurality of code lengths; and
operate a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

2. The apparatus of claim 1, wherein the plurality of decode streams comprises a first decode stream that is to iterate in a forward direction through the first portion of the plurality of code lengths and a second decode stream that is to iterate in a reverse direction through the second portion of the plurality of code lengths.

3. The apparatus of claim 1, wherein the plurality of decode streams comprises a first decode stream that is to iterate in a forward direction through the first portion of the plurality of code lengths and a second decode stream that is to iterate in a forward direction through the second portion of the plurality of code lengths.

4. The apparatus of claim 1, wherein the plurality of decode streams comprise three or more decode streams.

5. The apparatus of claim 1, wherein the prefix decoder engine is to:
determine that a plurality of consecutive code lengths of the header are the same value; and
simultaneously write the code lengths to a plurality of wordlines of the memory.

6. The apparatus of claim 5, wherein the prefix decoder engine is to provide an address and a corresponding tag to the memory to enable the memory to determine a plurality of wordlines to be enabled during a single write operation to write the plurality of consecutive code lengths to the plurality of wordlines of the memory.

7. The apparatus of claim 1, wherein the prefix decoder engine is to disable a bank of the memory based on a determination that a plurality of consecutive code lengths of the header each have a value of zero.

8. The apparatus of claim 1, further comprising a plurality of decompression engines each operable to decompress a payload based on codes decoded by the prefix decoder engine.

9. The apparatus of claim 1, wherein the codes are Huffman codes used to encode a DEFLATE payload.

10. The apparatus of claim 1, further comprising a battery communicatively coupled to a processor, a display communicatively coupled to the processor, or a network interface communicatively coupled to the processor.

11. A method comprising:
accessing a plurality of code lengths of a header associated with a compressed data block;
determining a number of instances of each code length of at least some of the plurality of code lengths; and
operating a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

12. The method of claim 11, wherein the plurality of decode streams comprises a first decode stream that is to iterate in a forward direction through the first portion of the plurality of code lengths and a second decode stream that is to iterate in a reverse direction through the second portion of the plurality of code lengths.

13. The method of claim 11, wherein the plurality of decode streams comprises a first decode stream that is to iterate in a forward direction through the first portion of the plurality of code lengths and a second decode stream that is to iterate in a forward direction through the second portion of the plurality of code lengths.

14. The method of claim 11, further comprising:
determining that a plurality of consecutive code lengths of the header are the same value; and
simultaneously writing the code lengths to a plurality of wordlines of a memory.

15. The method of claim 11, further comprising disabling a bank of a memory based on a determination that a plurality of consecutive code lengths of the header each have a value of zero.

16. At least one machine readable storage medium having instructions stored thereon, the instructions when executed by a machine to cause the machine to:
access a plurality of code lengths of a header associated with a compressed data block;
determine a number of instances of each code length of at least some of the plurality of code lengths; and
operate a plurality of decode streams in parallel, a first decode stream of the plurality of decode streams to iterate through a first portion of the plurality of code lengths and determine codes corresponding to the first portion of the plurality of code lengths, a second decode stream of the plurality of decode streams to iterate through a second portion of the plurality of code lengths and determine codes corresponding to the second portion of the plurality of code lengths.

17. The at least one medium of claim 16, wherein the plurality of decode streams comprises a first decode stream that is to iterate in a forward direction through the first portion of the plurality of code lengths and a second decode stream that is to iterate in a reverse direction through the second portion of the plurality of code lengths.

18. The at least one medium of claim 16, wherein the plurality of decode streams comprises a first decode stream that is to iterate in a forward direction through the first portion of the plurality of code lengths and a second decode stream that is to iterate in a forward direction through the second portion of the plurality of code lengths.

19. The at least one medium of claim 16, the instructions when executed to cause the machine to:
determine that a plurality of consecutive code lengths of the header are the same value; and
simultaneously write the code lengths to a plurality of wordlines of a memory.

20. The at least one medium of claim 16, the instructions when executed to cause the machine to disable a bank of a memory based on a determination that a plurality of consecutive code lengths of the header each have a value of zero.

* * * * *